(12) United States Patent
Matsuda et al.

(10) Patent No.: US 10,716,230 B2
(45) Date of Patent: Jul. 14, 2020

(54) WATERPROOF ELECTRONIC DEVICE AND PRODUCTION METHOD OF WATERPROOF ELECTRONIC DEVICE

(71) Applicant: Mitsubishi Electric Corporation, Tokyo (JP)

(72) Inventors: Yusuke Matsuda, Tokyo (JP); Koji Hashimoto, Tokyo (JP); Yoshitake Nishiuma, Tokyo (JP); Takashi Kurata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/408,577

(22) Filed: May 10, 2019

(65) Prior Publication Data
US 2019/0380220 A1    Dec. 12, 2019

(30) Foreign Application Priority Data

Jun. 11, 2018 (JP) ................. 2018-110773

(51) Int. Cl.
| | |
|---|---|
| *G06F 11/00* | (2006.01) |
| *H05K 5/06* | (2006.01) |
| *H05K 5/03* | (2006.01) |
| *H05K 5/00* | (2006.01) |
| *H05K 5/02* | (2006.01) |
| *H01R 13/41* | (2006.01) |

(Continued)

(52) U.S. Cl.
CPC ............ *H05K 5/069* (2013.01); *H01R 13/41* (2013.01); *H01R 13/5202* (2013.01); *H05K 5/0008* (2013.01); *H05K 5/0052* (2013.01); *H05K 5/0056* (2013.01); *H05K 5/0213* (2013.01); *H05K 5/0247* (2013.01); *H05K 5/03* (2013.01); *B60R 16/0239* (2013.01)

(58) Field of Classification Search
CPC ....................................... H05K 5/00
See application file for complete search history.

(56) References Cited

U.S. PATENT DOCUMENTS

| | | | |
|---|---|---|---|
| 2006/0048001 A1* | 3/2006 | Honda | G11B 33/142 714/6.32 |
| 2012/0127677 A1 | 5/2012 | Wakana et al. | |
| 2017/0238435 A1* | 8/2017 | Hashimoto | H01R 12/724 361/714 |

FOREIGN PATENT DOCUMENTS

| | | |
|---|---|---|
| JP | 2012-109161 A | 6/2012 |
| JP | 2017-147252 A | 8/2017 |

* cited by examiner

*Primary Examiner* — Jerry Wu
(74) *Attorney, Agent, or Firm* — Sughrue Mion, PLLC; Richard C. Turner

(57) ABSTRACT

The first annular sealing material is filled and applied between a first sealing surface provided on an outer peripheral part of the case and a second sealing surface provided on an outer peripheral part of the cover, a second annular sealing material is filled and applied between a first fitting member provided at the opening of the sealed housing and a second fitting member provided at the outer periphery of the body of the connector housing, a terminal part sealing material is applied to a connection surface which is an inner surface of the wall for partitioning inside and outside of the connector housing and is connected to the circuit substrate, the case and the cover are fastened together by a fastening member, the hermetically sealed housing is provided with a sealable ventilation passage that communicates the inside of the hermetically sealed housing with outside air.

20 Claims, 12 Drawing Sheets

(51) Int. Cl.
*H01R 13/52* (2006.01)
*B60R 16/023* (2006.01)

WATERPROOF ELECTRONIC DEVICE AND PRODUCTION METHOD OF WATERPROOF ELECTRONIC DEVICE

TECHNICAL FIELD

This application relates to a waterproof electronic device and method of producing waterproof electronic device, in particular, a waterproof electronic device with improved waterproof sealing performance and a method of producing waterproof electronic device, for example, the present invention can be applied to an in-vehicle electronic control device in which a circuit substrate is hermetically sealed in a hermetically sealed housing in which a part of an external connection connector is exposed.

BACKGROUND ART

A circuit substrate is hermetically sealed in a housing constituted by a case and a cover, a circuit component including a heat-generating component and a connector housing for an external wiring part in which a part is exposed from the housing are mounted on the circuit substrate, in a waterproof type electronic device unit in which a waterproof sealing material is applied to a joint surface between the case, the cover and the connector housing, generally, a water-repellent filter is provided on the inside part of the case or the cover, air inside the housing is released to the atmosphere by the water-repellent filter, the airtight seal performance is prevented from being impaired due to the pressure difference inside and outside the housing based on the temperature change inside the housing.

For example, as shown in FIG. 8 of the "waterproof electronic device unit" described in the following Patent literature 1, a circuit substrate 130 is hermetically sealed in a housing constituted by a base (a case in this application) 110 and a cover 120, and the waterproof electronic device unit includes a resin connector housing 131 mounted on the circuit substrate 130 wherein a part is exposed from a side opening part of the hermetically sealed housing and a plurality of connecting terminals 133 pressed into a body part (a wall for partitioning inside and outside in this application) 132 of the connector housing. The waterproof electronic device 100 is constituted in a manner that one end of the connection terminal 133 is connected to the circuit pattern of the circuit substrate 130, and the other end is in conductive contact with the contact terminal of the mating connector.

Further, similarly, in the three-way concave part 112 provided on the outer periphery of the base (case) 110 and the concave seal part 137 provided in the connector housing 131 shown in FIG. 11, the annular concave part 122 (see FIG. 8) of the cover 120 are fitted to each other. A second sealing material 142 (First annular sealing material in the present invention) is applied to each of the concave parts 112 and 137.

Also, according to FIGS. 3 and 5, in the concavity surface seal part 113 provided in the side opening part of the base (case) 110, a first sealing material 141 (second annular sealing material in the present invention) is applied, and is in contact with the outer surface of the body part 132 of the connector housing 131.

Furthermore, an intake port 116 is provided in the base (case) 110, and the intake port 116 is sealed by a water-repellent filter 117.

The water repellent filter 117 is constituted by a plane porous material including a plurality of microporosity which block the inflow passage of water droplets into the housing and pass the atmosphere freely, but the attachment structure is devised so that the porous material is not soiled directly by water.

On the other hand, as shown in FIG. 1, in the "control device for vehicle" the circuit substrate 100 is hermetically sealed in a housing constituted by the case 500 and the cover 130, a connection terminal is solder-connected to the circuit substrate 100, a first connector 300 whose part is exposed from the opening of the cover 130, and a second connector 200 in which a part of the opening is exposed from the opening of the case 500.

In the control device for vehicle of Patent literature 2, a waterproof adhesive 150 (first annular sealing material in the present invention) is applied to the outer periphery part of the case 500 and the cover 130, a fixing adhesive 400 is applied to the opening of the cover 130 and the groove part 320 of the first connector 300, a fixing adhesive 600 (second annular sealing material in the present invention) is applied to the opening of the case 500 and the groove part 240 of the second connector 200, sealing agents 900 and 800 (terminal part sealing material 600 in the present application) are applied respectively to the connection terminal 310 provided in the first connector 300 and the connection terminal 210 provided in the second connector 200. In this way, it has been devised to obtain a control device for vehicle having two connectors with a simple structure by ensuring a holding force against external force and waterproofness.

PRIOR ART DOCUMENT

Patent Literature

[Patent Literature 1] JP2017-147252 A (Ref. FIG. 8 and [Abstract])
[Patent Literature 2] JP2012-109161 A (Ref. FIG. 1 and [Abstract])

SUMMARY OF INVENTION

Technical Problem

In the "waterproof electronic device unit" according to the Patent literature 1, an air intake port 116 is provided in a housing (a base 110 and a cover 120) for housing the circuit substrate 130, and the intake port 116 is sealed by the water-repellent filter 117. Therefore, when integrating the base 110 and the cover 120 with the fastening screw 139, even if the first and second sealing materials 141 and 142 previously applied are uncured, when the housing internal air is excessively pressurized, the first and second sealing members 141 and 142 do not overflow from the sealing surface, further, in the practical operational phase, there is no possibility of water absorption from the press-fitting surface between the connector housing 131 and the connection terminal 133 due to the difference in pressure inside and outside the housing, a sealing material for the connection terminal 133 is not required.

However, there is a problem of cost increase accompanying the use of the water-repellent filter, in addition, when the water-repellent filter is contaminated with muddy water and the microporosity of the water-repellent filter are blocked, the water-repellent filter loses the air pressure equalization effect, there is a possibility that water submerged in the wiring harness may enter from the press-fitting surface between the connector housing 131 and the connection terminal 133, there is a problem that the attachment location of the water-repellent filter is restricted. Furthermore, even if the water repellent filter is normal, there is resistance to ventilation by the microporosity, there is a problem that the overflow phenomenon of the sealing material cannot be completely stopped at the assembly phase of the sealed housing.

On the other hand, instead of the water-repellent filter being used, the "control device for vehicle" since the sealing agents 900 and 800 are respectively provided on the connection terminals 310 and 210 provided in the first and second connectors 300 and 200, even if a difference in pressure between the inside and outside of the housing occurs at the practical operational phase, there is a characteristic that water is not absorbed from the press-fitting surfaces of the connection terminals 310 and 210.

However, when integrating the case 500 and the cover 130 with the screw 160, the air inside the housing is pressurized, the waterproofing adhesive 150 and the fixing adhesive agent 400 and 600 in an uncured state are overflowed from the adhesion surface, there is a risk that water absorption will occur from this overflow position in the practical operational phase. Therefore, if the seal pass of the adhesion surface is increased, there is a problem that the entire device becomes larger.

Further, when press-fitting the connection terminal into the terminal press-fitting fine hole provided in the connector, in order to prevent the contact surface between the connection terminal and the mating connector from being damaged, the connection terminal is press-fitted into the connector from the solder connection position of the connection terminal, in order to facilitate this press-fitting operation, if the draft angle of the terminal press-fitting fine hole is provided on the outside, there is a problem that it is easy to flood from the outside of the connector.

Furthermore, when soldering the terminal 310 of the first connector 300 to the substrate 100, it is necessary to attach and fix the substrate 100 to the cover 130 in advance, so there is a problem that soldering work becomes difficult.

It is an object of the present application to provide a waterproof sealing material that can easily be filled in a process of assembling a waterproof electronic device without using a water-repellent filter, and a waterproof electronic device having a compact and simple structure and a method for producing a waterproof electronic device that can maintain airtightness even if a pressure difference occurs inside and outside the housing in the practical stage of this waterproof electronic device.

Solution to Problem

The waterproof electronic device disclosed in this application, having: a hermetically sealed housing constituted by a case and a cover having an opening, a circuit substrate hermetically sealed in the hermetically sealed housing, a resin-made connector housing having a wall for partitioning inside and outside mounted on the circuit substrate and partially exposed from the opening of the hermetically sealed housing, and a plurality of connection terminal press-fitted into the wall for partitioning inside and outside of the connector housing, wherein; one end of the connection terminal is connected to a circuit pattern of the circuit substrate and the other end of the connection terminal is in conductive contact with a contact terminal of a mating connector, a first annular sealing material is filled and applied between a first sealing surface provided on an outer peripheral part of the case and a second sealing surface provided on an outer peripheral part of the cover, a second annular sealing material is filled and applied between a first fitting member provided at the opening of the sealed housing and a second fitting member provided at the outer periphery of the body of the connector housing, a terminal part sealing material is applied to a connection surface which is an inner surface of the wall for partitioning inside and outside of the connector housing and is connected to the circuit substrate, the case and the cover are fastened together by a fastening member so as to be integrated to constitute the hermetically sealed housing, the hermetically sealed housing is provided with a sealable ventilation passage that communicates the inside of the hermetically sealed housing with outside air.

In this application, a method of producing a waterproof electronic device having a hermetically sealed housing constituted by a case and a cover having an opening, a circuit substrate hermetically sealed in the hermetically sealed housing, a resin-made connector housing having a wall for partitioning inside and outside mounted on the circuit substrate and partially exposed from the opening of the hermetically sealed housing, a plurality of connection terminal press-fitted into the wall for partitioning inside and outside of the connecter housing, and one end of the connection terminal connected to a circuit pattern of the circuit substrate and the other end being in conductive contact with a contact terminal of a mating connector, the method having the steps of: filling and applying a first annular sealing material between a first sealing surface provided on an outer peripheral part of the case and a second sealing surface provided on an outer peripheral part of the cover; filling and applying a second annular sealing material between a first fitting member provided at the opening of the sealed housing and a second fitting member provided at the outer periphery of the body of the connector housing; applying a terminal part sealing material to a connection surface which is an inner surface of the wall for partitioning inside and outside of the connector housing and is connected to the circuit substrate; and providing the hermetically sealed housing with a sealable ventilation passage that communicates the inside of the hermetically sealed housing with outside air, wherein in the step of providing the hermetically sealed housing with the sealable ventilation passage, the ventilation passage is sealed when the case and the cover are integrated with a fastening member or after the case and the cover are integrated.

Advantageous Effects of Invention

According to the waterproof electronic device and the method of producing the waterproof electronic device disclosed in this application, in the process of integrating the case and the cover, the first annular sealing material and the second annular sealing material which are applied in advance are not pressed and flown out, as the air inside the housing flows out through the ventilation passage, when the case and the cover are integrated, or after being integrated, the ventilation passage can be closed, waterproofness during practical operation is not impaired, even if the air pressure inside the hermetically sealed housing changes due to the temperature difference between the inside and the outside of the hermetically sealed housing, it is possible to prevent water from being introduced from the press-fitting part between the connector housing and the connecting terminal. According to this, it becomes unnecessary to use a conventionally used water repellent filter and there is an effect of softening the restriction on the attachment place of the hermetically sealed housing.

DESCRIPTION OF EMBODIMENTS

First Embodiment (1) Detailed Explanation of the Configuration

Figure 1:
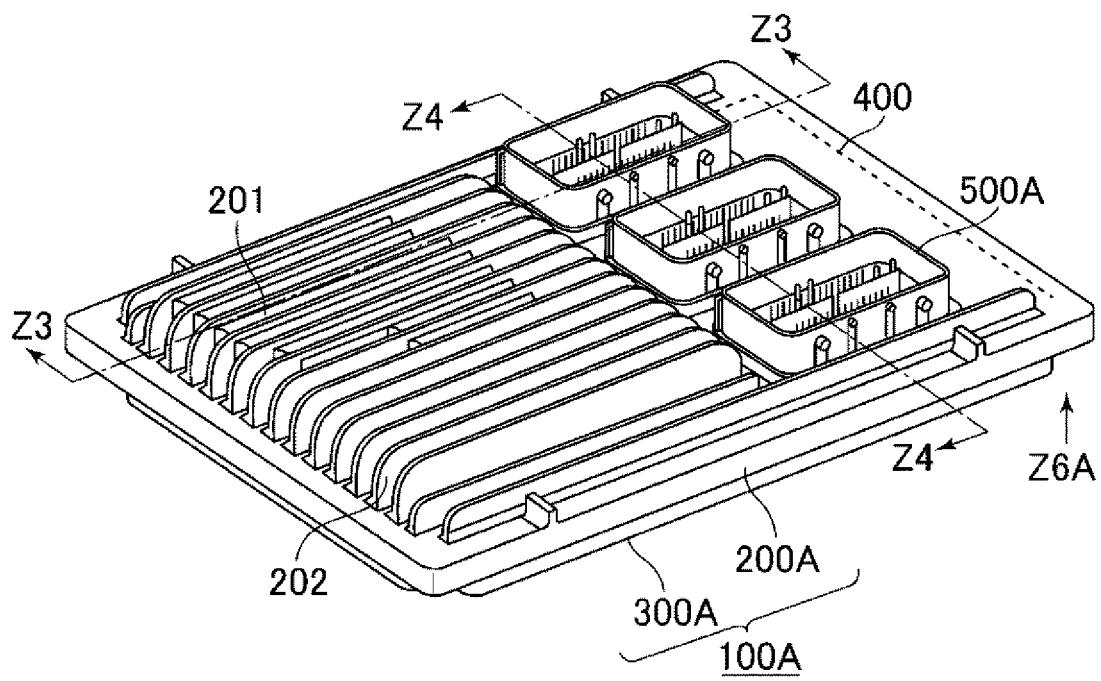
FIG. 1 is a diagram showing an example of a waterproof electronic device according to the first embodiment of the present application, and is a top appearance view as seen from the upper surface side.
Figure 2:
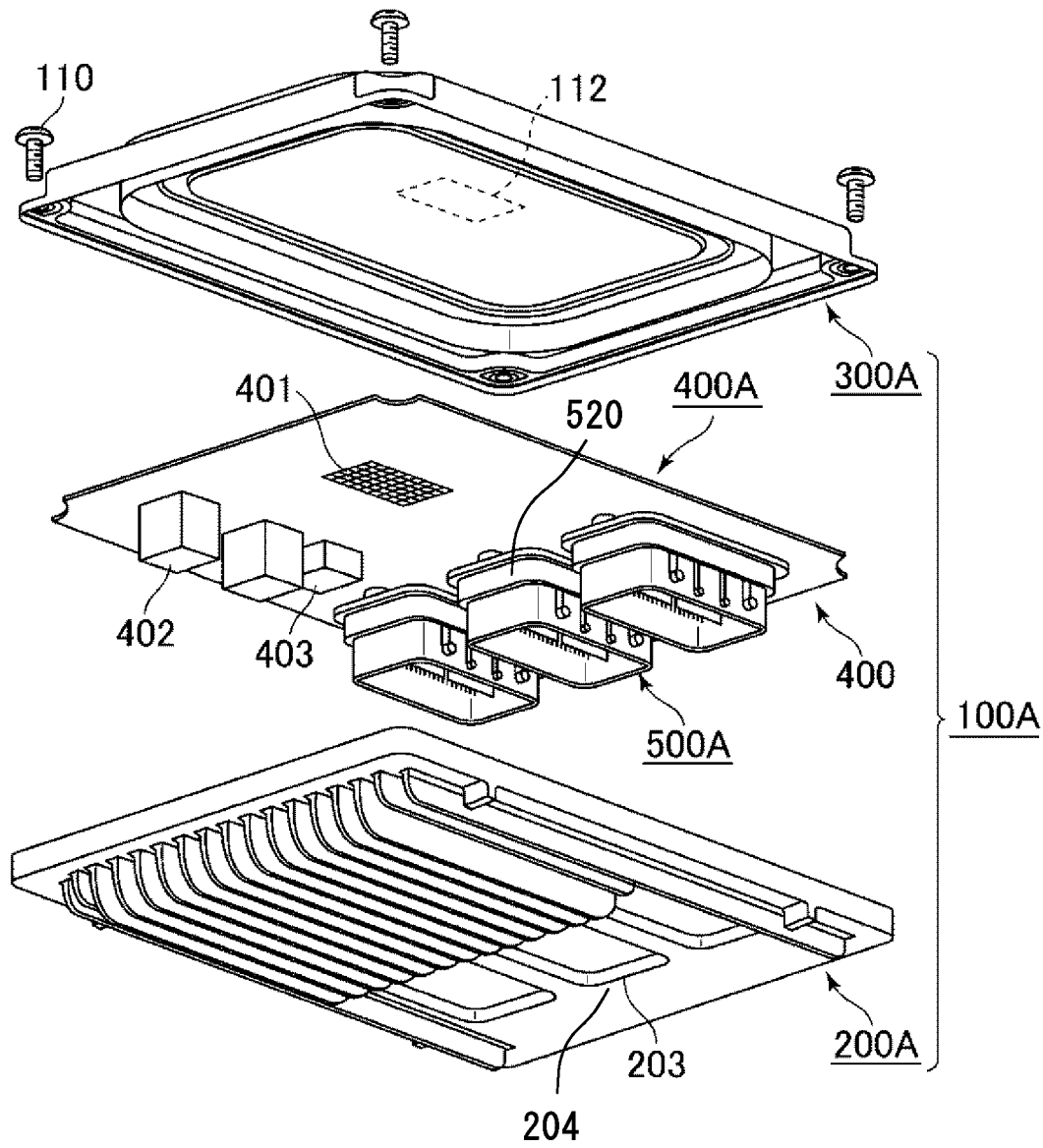
FIG. 2 is a disassembled structural view of the disassembled waterproof electronic device shown in FIG. 1, as seen from the bottom surface side.
Figure 3:
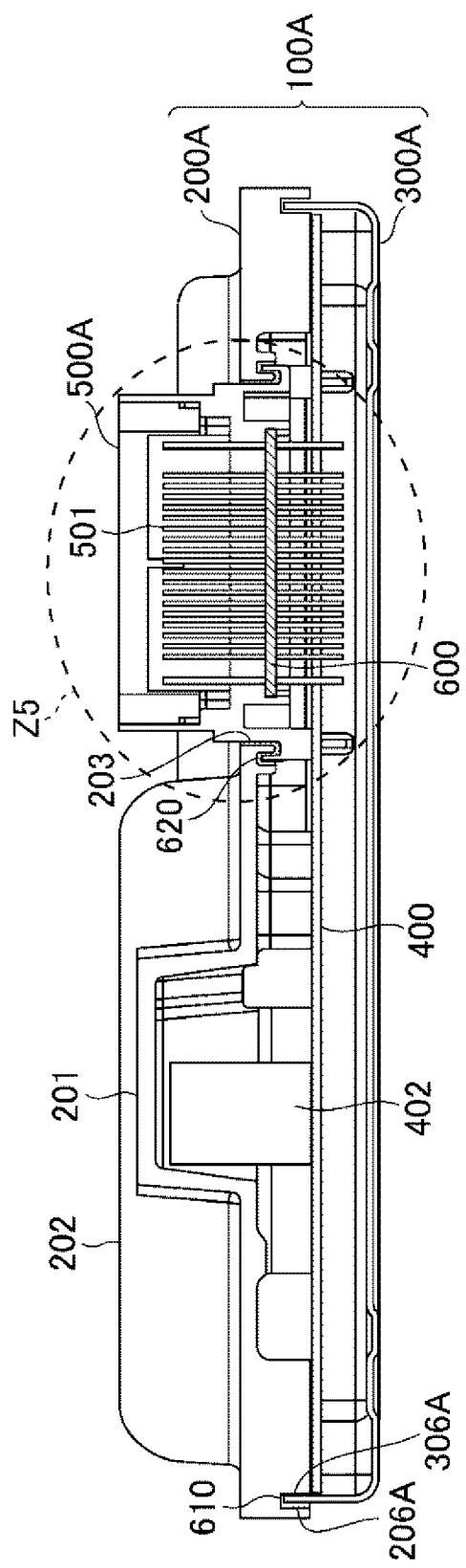
FIG. 3 is a vertical front view showing a cross section taken along line Z3-Z3 shown in FIG. 1 as seen in the direction of the arrow.
Figure 4:
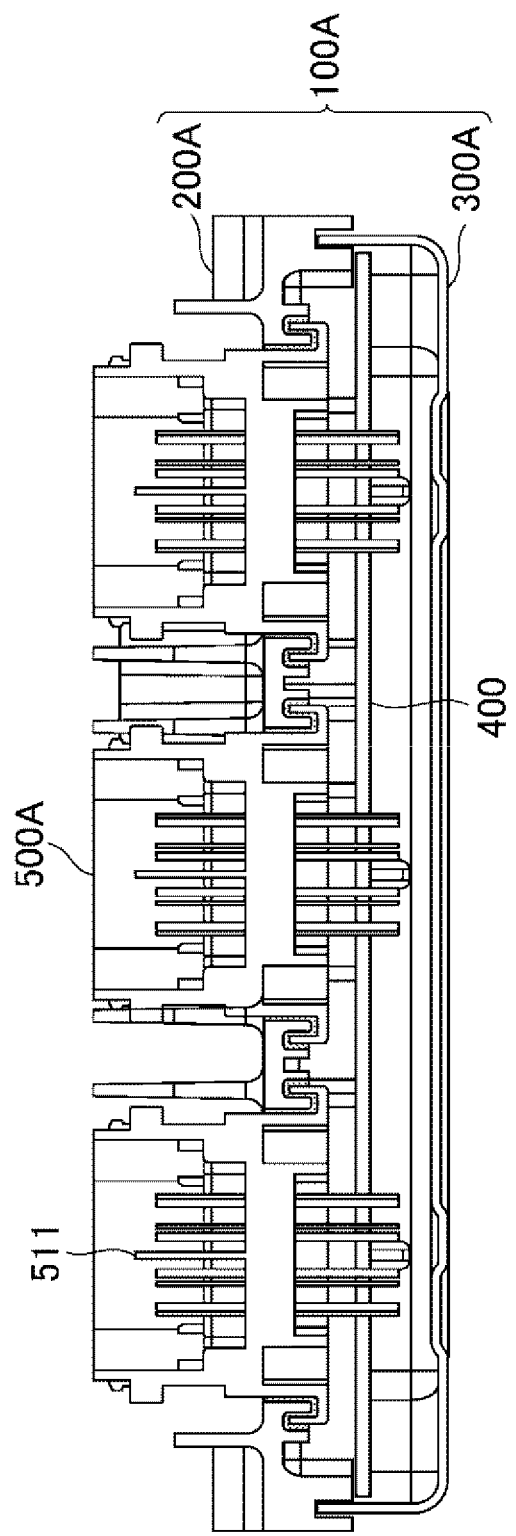
FIG. 4 is a longitudinal sectional side view of a cross section taken along the line Z4-Z4 shown in FIG. 1 as seen in the direction of the arrow.

FIG. 1 which is a top external view of the waterproof electronic device according to the first Embodiment, FIG. 2 which is disassembled structural view of the waterproof electronic device of FIG. 1, FIG. 3 which is a longitudinal front view of the section taken along the line Z3-Z3 of FIG. 1 as seen in the direction of the arrows, and FIG. 4 which is a vertical cross-sectional side view of the cross section taken along the line Z4-Z4 of FIG. 1 as seen in the direction of the arrow will be explained.

In FIGS. 1 and 2, the hermetically sealed housing 100A is configured to integrate a case 200A made of aluminum die-cast and a cover 300A made of sheet metal fastened by fastening members 110 each having four corners, for example, four screws. A circuit substrate 400 on which the connector housing 500A is mounted is hermetically sealed in the hermetically sealed housing 100A. A label 112, which is a rating plate, is affixed to the outer surface of the cover 300A.

The deep bottom ceiling outer surface 201 indicates the outer surface of the deep side part provided in a part of the case 200A, and the heat sink 202 is provided on the outer surface of the case 200A. An opening 203 (see FIG. 2) is provided in the case 200A, and a part of the connector housing 500A is exposed from this opening 203.

On the circuit substrate 400, on the upper surface opposite to the mounting surface (lower surface in FIG. 2) of the connector housing 500A, for example, an integrated circuit device 401 including a microprocessor is mounted, on the lower surface, a tall component 402 such as an electrolytic capacitor and a heat-generating component 403 such as a transistor are mounted. The circuit substrate 400 and the connector housing 500A are integrated to form the board assembly 400A.

In FIG. 3 and FIG. 4 a first concave part 206A is provided on the outer periphery of the case 200A, a second convex part 306A is provided on the outer periphery of the cover 300A, the first concave part 206A and the second convex part 306A are fitted to each other. A first annular sealing material 610 described later in FIG. 6B is applied to the first concave part 206A.

Figure 5:
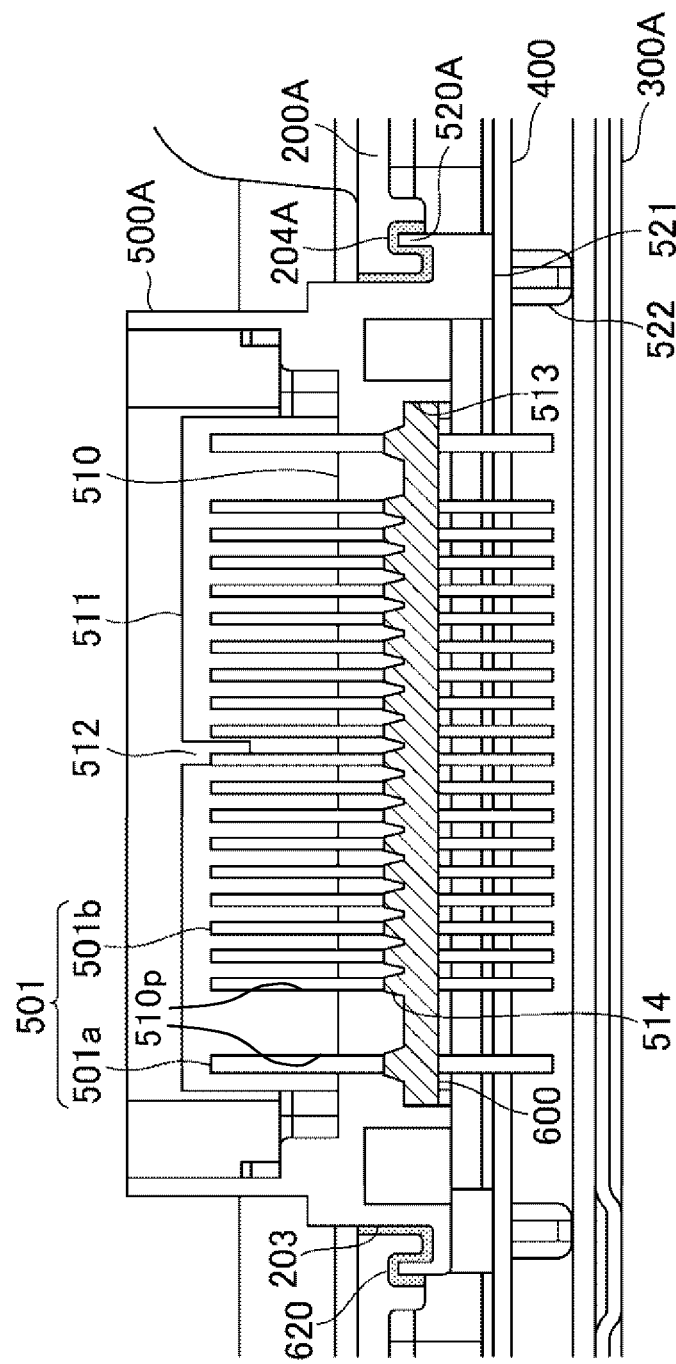
FIG. 5 is an enlarged detailed longitudinal sectional front view of a subregion surrounded by a dotted line Z5 in FIG. 3.

A second annular sealing material 620, which will be described later with reference to FIG. 5, is applied to the outer periphery of the outline of the connector housing 500A, a part of which is exposed from the opening part 203 of the case 200A, the inner surface of the connector housing 500A into which the connecting terminal 501 is press-fitted is filled with the terminal part sealing material 600.

The tall component 402 provided on the circuit substrate 400, the deep bottom ceiling outer surface 201, and the heat sink 202 are configured as described above, the terminal partition wall 511 in FIG. 4 is formed integrally with the connector housing 500A.

Figure 6A:
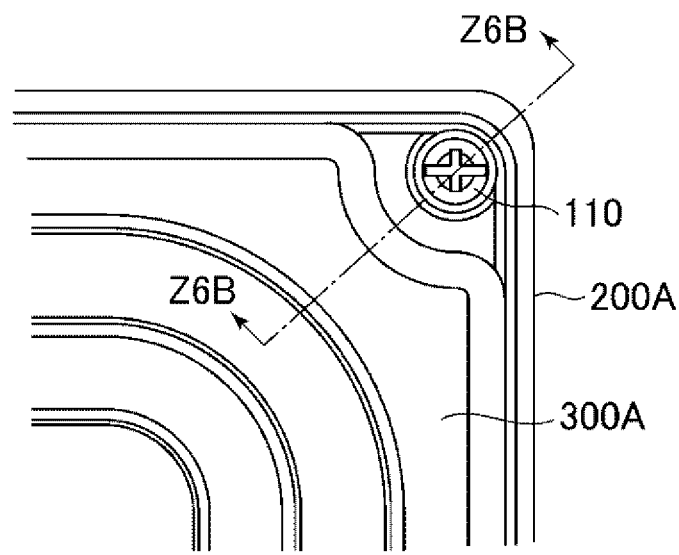
FIG. 6A is a view showing a fastening member in a part indicated by an arrow Z6 A in FIG. 1, and is an enlarged bottom view seen in a direction of an arrow Z6 A in FIG. 1.
Figure 6B:
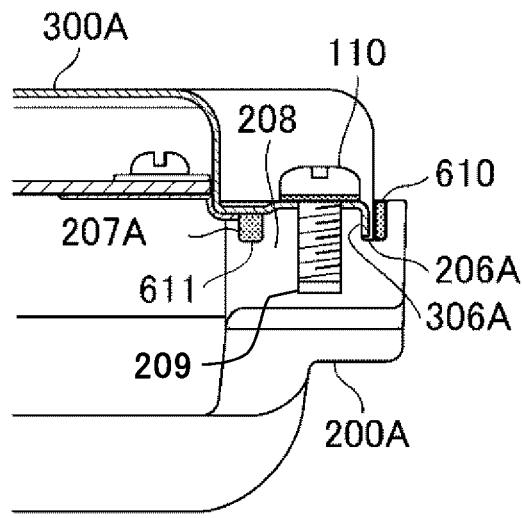
FIG. 6B is a longitudinal cross-sectional view of a fastening part of the cross section taken along the line Z6B-Z6B in FIG. 6A as seen in the direction of the arrow.
Figure 6C:
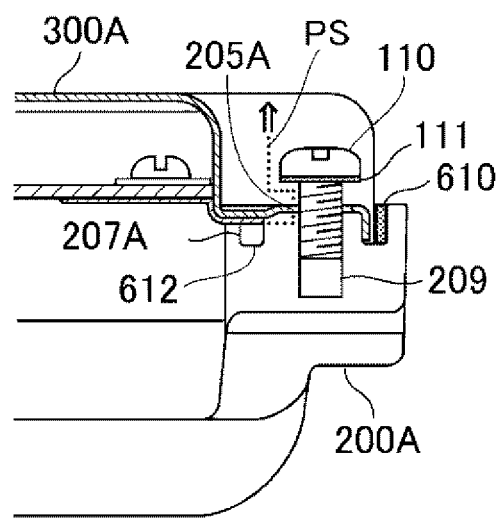
FIG. 6C is a longitudinal cross-sectional view of the fastening part at a part different from that in FIG. 6A.
Figure 7:
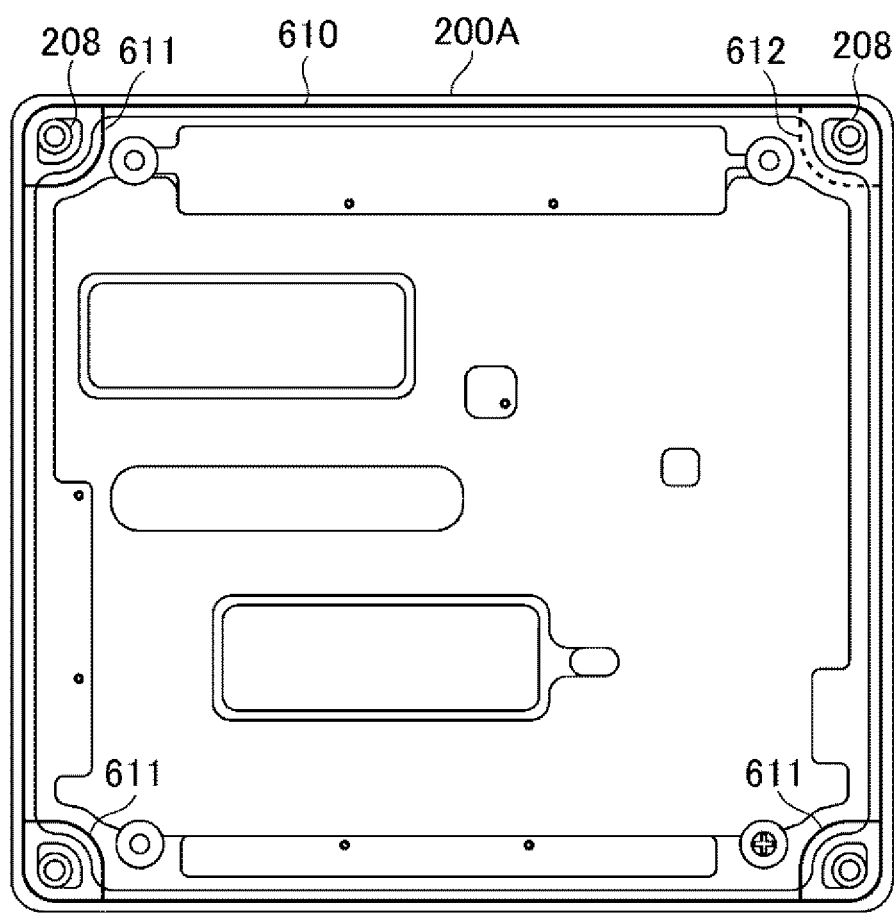
FIG. 7 is a bottom view of the interior of the case in FIG. 1.

Next, FIG. 5 which is an enlarged detailed vertical sectional front view of a partial region surrounded by a dotted line Z5 in FIG. 3 and a fastening part in a part Z6A in FIG. 1, FIG. 6A which is an enlarged bottom view seen in the direction of arrow Z6A, FIG. 6B which is a vertical cross-sectional view of the fastening part when the cross section taken along the line Z6B-Z6B in FIG. 6A is seen in the direction of the arrows, FIG. 6C which is a longitudinal sectional view of the fastening part at a part different from FIG. 6B in FIG. 6A, FIG. 7 which is a bottom view of the interior of the case in FIG. 1 will be explained in order.

In FIG. 5, the resin connector housing 500A, into which the mating connector (not shown) is inserted, provides a wall 510 for partitioning inside and outside, a terminal partition wall 511 (see FIG. 4), a wrong insertion preventing groove 512 provided in the terminal partition wall 511, and a peripheral wall part 513 filled with the terminal part sealing material 600.

The plurality of connection terminals 501 to be press-fitted into the terminal press-fitting fine holes 510p provided in the wall 510 for partitioning inside and outside, are divided into a large number of signal terminals 501b having a small cross-sectional area, and a small number of power terminals 501a having large cross-sectional areas provided in each of four inner corners of the connector housing 500A.

The power terminal 501a and the signal terminal 501b are soldered to the connection land of the circuit substrate 400.

The distance between the circuit substrate 400 and the connector housing 500A and the mounting position is regulated by the positioning abutting surface 521 and the positioning penetrating part 522 provided in the connector housing 500A.

On the other hand, the opening part 203 of the case 200A is provided with a first fitting recess 204A, and the second annular sealing material 620 is applied to the first fitting recess 204A. A second fitting projection 520A provided in the connector housing 500A fits into the first fitting recess 204A to which the second annular sealing material 620 is applied. Further, near the exit of the terminal press-fitting fine hole 510p of the connection terminal 501 provided in the wall 510 for partitioning inside and outside, an accumulating part 514 is provided, into which the terminal part sealing material 600 flows, with the hole diameter increased.

In FIG. 6A, FIG. 6B, FIG. 6C, and FIG. 7, a first concave part 206A is provided on the outer periphery of the case 200A, a first annular sealing material 610 is applied to the first concave part 206A.

A junction concave line 207A is provided so as to surround each of the fastening seat 208 provided at the four corners of the case 200A, the fastening part sealing material 611 is applied to three of these four junction concave line 207A, the remaining one junction concave line 207A is a seal removal part 612 to which no sealant is applied (see FIG. 7).

Each of the fastening seat 208 is provided with a screw hole 209 so that the cover 300A is screwed and fixed to the case 200A at four corners by the fastening member 110 (see FIG. 6B).

An elastic packing 111 is used for the fastening member 110 corresponding to the seal removal part 612 (see FIG. 6C).

Further, as shown in the upper left part of FIG. 7 and FIG. 6B, when the fastening seat 208 is surrounded by the first annular sealing material 610 and the fastening part sealing material 611, even if ventilation occurs between the surfaces of the mutual contact surface between the head of the fastening member 110 and the cover 300A, a ventilation action between the inside air and the outside air of the hermetically sealed housing 100A does not occur.

However, as shown in the upper right part of FIG. 7 and FIG. 6C, when the fastening seat 208 is not surrounded by the first annular sealing material 610 and the fastening part sealing material 611, if ventilation occurs between the surfaces of the mutual contact surface between the head of the fastening member 110 and the cover 300A, a ventilation action between the inside air and the outside air of the hermetically sealed housing 100A occurs. Until the fastening member 110 is tightened to the final position, depending on the air hole 205A as a ventilation opening forming the ventilation passage PS, a ventilation effect arises freely between the inside air and the outside air of the hermetically sealed housing 100A, when the fastening member 110 is tightened to the final position, the air hole 205A is closed by the action of the elastic packing 111, ventilation of the inside and outside of the hermetically sealed housing 100A is not performed.

(2) Detailed Explanation of the Assembly Procedure

First, the assembly procedure of the waterproof electronic device unit 100A will be described in detail with reference to FIG. 2, FIG. 5, FIG. 6A, FIG. 6B, FIG. 6C and FIG. 7.

As illustrated in FIG. 2, the case 200A is installed in an assembly jig (not shown) with its inner surface facing the ceiling, under this installation state, as illustrated in FIGS. 6B and 6C, the first annular sealing material 610 is applied to the first concave part 206A of the case 200A and the fastening part sealing material 611 is annularly applied to the branching junction concave line 207A of the case 200A, further, as illustrated in FIG. 5, the second annular sealing material 620 is annularly applied to the first fitting recess 204A of the case 200A.

Next, the board assembly 400A (see FIG. 2) is mounted on the tray part provided on the inner surface of the case 200A (see FIG. 3, FIG. 4, and FIG. 5).

Further, the cover 300A is mounted on the case 200A on which the board assembly 400A is mounted and at the four corners of the cover 300A, the cover 300A is fastened to the case 200A, the cover 300A is fixed to the case 200A on which the board assembly 400A is mounted, a waterproof electronic device in which a case 200A on which a board assembly 400A is mounted and a cover 300A are integrated is assembled.

As described above, the elastic packing 111 is used for the part (see FIG. 6C) where the fastening part sealing material 611 has not been applied to the junction concave line 207A of the case 200A, the elastic packing 111 may be used for all the fastening members 110 regardless of the presence or absence of the fastening part sealing material 611.

Further, each inspection of the appearance and performance of the waterproof electronic device assembled as described above is performed by an inspection jig (not shown) as a result of each inspection, a label 112 (see FIG. 2) as a rating name plate is affixed to the waterproof type electronic device which is judged as acceptance, after confirming that the label 112 has been affixed, the assembly of the waterproof electronic device is completed.

Next the assembly procedure of the board assembly 400A itself will be described with reference to FIG. 5.

In FIG. 5, the connection terminal 501 is first press-fitted into the terminal press-fitting fine hole 510p with respect to a single piece of the connector housing 500A which is a resin molded material. The press-fitting direction of the connection terminal 501 into the terminal press-fitting fine hole 510p is a direction from the outside of the wall 510 for partitioning inside and outside to the inside (from the top to the down in FIG. 5), as a result, scratches do not occur on the contact surface part with the mating connector (not shown).

Next, the terminal part sealing material 600 is filled in the space part constituted by the inner surface of the wall 510 for partitioning inside and outside and the peripheral wall part 513. The terminal part sealing material 600 has lower viscosity than either of the first annular sealing material 610 and the second annular sealing material 620, therefore, the filling of the terminal part sealing material 600 into the space part is promptly performed through a space between a large number of connection terminals 501 arranged at a narrow pitch.

In this way, the connector assembly is configured.

The configured connector assembly is mounted on the circuit substrate 400, the connection terminals 501 of the connector assembly are soldered to the circuit substrate 400.

However, this assembling procedure describes a preferable procedure, after the connecting terminal 501 is press-fitted into the connector housing 500A, the connector housing 500A into which the connection terminal 501 is press-fitted is mounted on the circuit substrate 400, the soldering of the connection terminal 501 to the circuit substrate 400 is performed, it is also possible to inject the terminal part sealing material 600 from the injection hole of the sealing material provided on the circuit substrate 400. According to this procedure, there is a characteristic that the terminal part sealing material 600 is not exposed to the high temperature environment accompanying the soldering operation.

(3) Summary and Features in the First Embodiment

As is clear from the above explanation, the waterproof electronic device according to the first embodiment has the circuit substrate 400 hermetically sealed in a hermetically sealed housing 100A constituted by a case 200A and a cover 300A, the waterproof electronic device includes a resin-made connector housing 500A which is mounted on the circuit substrate and a part thereof is exposed from the opening 203 of the hermetically sealed housing 100A and a plurality of connection terminals 501 press-fitted into the wall 510 of the connector housing, and in which one end of the connection terminal 501 is connected to the circuit pattern of the circuit substrate 400 and the other end is in conductive contact with a contact terminal of a mating connector, a first annular sealing material 610 is filled and applied between the first sealing surface SL1 provided on the outer peripheral part of the case 200A and the second sealing surface SL2 provided on the outer peripheral part of the cover 300A, the second annular sealing material 620 is filled and applied between the first fitting member 204 provided at the opening 203 of the sealed housing 100A and the second fitting member 520 provided at the outer periphery of the body of the connector housing 500A, a terminal part sealing material 600 is applied to a connecting surface which is the inner surface of the wall 510 for partitioning inside and outside of the connector housing 500A and is connected to the circuit substrate 400, the sealed housing 100A is provided with a ventilation passage PS having an air hole 205A as an air vent that communicates the interior thereof with the atmosphere, and the ventilation passage PS is sealed when the case 200A and the cover 300A are integrated by the fastening member 110.

The first sealing surface SL1 includes a first concave part 206A provided on the outer peripheral part of the case 200A, the second sealing surface SL2 includes a second convex part 306A provided on the outer periphery of the cover 300A, the first annular sealing material 610 is applied to the first concave part 206A, and is engaged with the second convex part 306A, the first fitting member 204 includes a first fitting recess 204A provided in the opening 203 of the case 200A, the second fitting member 520 includes a second fitting projection 520A provided on the outer peripheral part of the body of the connector housing 500A, the second annular sealing material 620 is applied to the first fitting recess 204A and is engaged with the second fitting projection 520A, the first annular sealing material 610 is applied to the first recess 206A and the second annular sealing material 620 is applied to the first fitting recess 204A as a first combination, the case 200A is provided with a screw hole 209 into which a screw as the fastening member 110 is screwed.

As described above, the technical feature 1 of this application has the following features.

The first annular sealing material 610 is filled and applied between a first sealing surface SL1 provided on an outer peripheral part of the case 200A and a second sealing surface SL2 provided on an outer peripheral part of the cover 300A, a second annular sealing material 620 is filled and applied between a first fitting member 204 provided at the opening 203 of the sealed housing 100A and a second fitting member 520 provided at the outer periphery of the body of the connector housing 500A, a terminal part sealing material 600 is applied to a connection surface which is an inner surface of the wall 510 for partitioning inside and outside of the connector housing 500 and is connected to the circuit substrate 400, the case 200A and the cover 300A are fastened together by a fastening member 110 so as to be integrated to constitute the hermetically sealed housing 100, the hermetically sealed housing 100A is provided with a sealable ventilation passage PS that communicates the inside of the hermetically sealed housing 100A with outside air. Therefore, without using a water-repellent filter, it is easy to fill the waterproof sealing material in the assembling process of the waterproof electronic device. At the practical stage of this waterproof electronic device, it is possible to provide a waterproof electronic device having a compact and simple structure and a method for producing a waterproof electronic device that can maintain airtightness even if a pressure difference occurs inside and outside the housing in the practical stage of this waterproof electronic device.

Further, the technical feature 2 of this application has the following features.

The first annular sealing material 610 and the second annular sealing material 620 are respectively applied to the concave part 206A of the case 200A and the concave part 204A of the case 200A. A screw hole 209 into which the fastening member 110 is screwed is provided on the side of the case 200A having the concave part 206A. Therefore, firstly, as the inner surface of the case 200A faces the ceiling, then the board assembly 400C of the circuit substrate 400 and the connector housing 500A is mounted on the case 200A, thereafter, the cover 300A is put on the case 200A on which the board assembly 400C is mounted, and furthermore, the case 200A and the cover 300A are screwed and fastened to each other with the fastening member 110, the assembly can be easily performed from one direction.

Both the first annular sealing material 610 and the second annular sealing material 620 are made of a room temperature or thermosetting adhesive having a viscosity of 15 Pa·s or more. As the terminal part sealing material 600, a gel material for non-conductive and room temperature or thermosetting potting is used. The viscosity of the terminal part sealing material 600 is lower than the viscosity of the first annular sealing material 610 and the second annular sealing material 620 but has heat resistance not melting at the solder melting temperature. The connector housing 500A includes a container-shaped space part constituted by an inner surface of the wall 510 for partitioning inside and outside and four peripheral wall parts 513 and an accumulating part 514 provided on the inner surface of the wall 510 for partitioning inside and outside. In the space part, after the connection terminal 501 is press-fitted into the wall 510 for partitioning inside and outside, the terminal part sealing material 600 is injected to form the connector assembly. The connector assembly is mounted on the circuit substrate 400, and solder connection is made to the circuit substrate 400, thereby constituting the board assembly 400A.

Further, the technical feature 3 of this application has the following features.

For the first annular sealing material 610 and the second annular sealing material 620, a silicone resin having a medium viscosity or higher is used, since the silicone resin of low viscosity is injected into the space part of the terminal part sealing material 600, the first annular sealing material 610 and the second annular sealing material 620 can be easily applied to the sealing surface and the annular sealing materials 610 and 620 are prevented from flowing out when integrating the case and the cover. Further, the terminal part sealing material 600 can easily diffuse and spread through a plurality of connecting terminals 501 into a predetermined space part, in addition, the terminal part sealing material 600 does not melt out according to the solder connection temperature. In addition, the accumulating part 514 provided in the connector housing is filled with the terminal part sealing material 600, thereby enhancing the waterproof effect.

These features are the same for the second and third embodiments.

The connection terminal 501 arranged in a planar manner in the wall 510 for partitioning inside and outside are formed in a rectangular shape, a plurality of signal terminals 501b and a plurality of but a few power terminals 501a having a larger cross-sectional area than the signal terminals 501b. The power terminal 501a is arranged at four target positions. The arrangement interval P between the plurality of signal terminals 501b that is set to be shorter than the terminal width W of the signal terminal 501b, is a narrow pitch dimension which have a relation with the 3 xWP 5 xW formula. The cross-sectional area of the power terminal 501a is three times or more the cross-sectional area of the signal terminal 501b.

As described above, the technical feature 4 of this application has the following features.

The connection terminal 501 is classified into a power terminal 501a through which a large current flows and a signal terminal 501b with a small current, by reducing the cross-sectional area of the signal terminal 501b and limiting the arrangement interval between the plurality of signal terminals 501b to a small dimension, sectional area of the connector housing 500A can be reduced. In order to arrange the signal terminals 501b with a small cross section at a narrow pitch, it is necessary to loose fit the degree of press-fitting of the signal terminal 501b into the connector housing 500A, if the engagement is loosened, leakage or flooding occurs as the pressure difference due to the temperature difference between the inside and the outside of the sealed housing 100A occurs. However, the terminal part sealing material 600 is for preventing this.

These features are the same for the second and third embodiments.

The first sealing surface SL1 includes a first concave part 206A provided on the outer peripheral part of the case 200A. The second sealing surface SL2 is provided on the outer periphery of the cover 300A and includes a convex part 306A fitted to the first concave part 206A. A junction concave line 207A arranged so as to surround a plurality of fastening seat 208 to be fastening faces by a plurality of the fastening member 110 is provided in the first concave part 206A to which the first annular sealing material 610 is applied. In the structure in which ventilation to the outside via the fastening surface is prevented by applying the fastening part sealing material 611 to the junction concave line 207A, the fastening part sealing material 611 is not applied to a part of the junction concave line 207A, the air hole 205A for ventilating air from the fastening surface to the outside is formed. An elastic packing 111 is used for the packing of the fastening member 110 applied to the fastening surface of the part where the air hole 205A is formed.

As described above, the technical feature 5 of this application has the following features.

Since the fastening seat 208 for integrating the case 200A and the cover 300A by the fastening member 110 is surrounded by the first annular sealing material 610 and the fastening part sealing material 611, the remaining fastening part from the inside of the housing shuts off.

In the part of the fastening part, by not applying the fastening part sealing material 611, an air hole 205A that communicates the part of the fastening part and the inside air of the housing is generated. The fastening part having the air hole 205A has a structure in which the elastic packing 111 is interposed in the fastening member 110, accordingly, the air hole 205A is sealed at the time of engagement completion. Therefore, there is a feature that the air hole 205A is automatically closed in the assembly final step.

In the second embodiment described later in which the junction concave line 307B is provided so as to surround the fastening seat 308, similar air hole 205A can be closed by using the elastic packing 111 for the fastening member 110 to which the fastening part sealing material 611 is not applied, in that case, in the second embodiment to be described later, the air hole 205B blocked by the label 112 is unnecessary.

As shown in FIGS. 1 to 7, the waterproof electronic device according to the first embodiment has the following characteristic configuration applied.

The circuit substrate 400 is hermetically sealed in the hermetically sealed housing 100A constituted by the case 200A and the cover 300A, the waterproof electronic device includes a resin connector housing 500A mounted on the circuit substrate 400 which is partially exposed from the opening 203 of the hermetically sealed housing 100A and a plurality of connection terminal 501 press-fitted into the wall 510 for partitioning inside and outside of the connector housing 500A, one end of the connection terminal 501 is connected to the circuit pattern of the circuit substrate 400, the other end is in conductive contact with the contact terminal of the mating connector, a first annular sealing material 610 is filled and applied between the first sealing surface SL1 provided on the outer peripheral part of the case 200A and the second sealing surface SL2 provided on the outer peripheral part of the cover 300A. Between the first fitting recess 204A provided in the opening 203 of the sealed housing 100A and the second fitting projection 520A provided on the outer periphery of the body of the connector housing 500A, a second annular sealing material 620 is filled and applied, a terminal part sealing material 600 is applied to a connecting surface which is the inner surface of the wall 510 for partitioning inside and outside of the connector housing 500A and is connected to the circuit substrate 400. The hermetically sealed housing 100A is provided with a ventilation passage PS having an air hole 205A as a sealed air vent that communicates the inside with the ventilation passage.

The circuit substrate 400 hermetically sealed in the hermetically sealed housing 100A constituted by the case 200A and the cover 300A, the waterproof electronic device includes a resin-made connector housing part 500A which is mounted on the circuit substrate and a part thereof is exposed from the opening 203 of the hermetically sealed housing 100A and a plurality of connection terminals 501 press-fitted into the wall 510 of the connector housing, and in which one end of the connection terminal 501 is connected to the circuit pattern of the circuit substrate 400 and the other end is in conductive contact with a contact terminal of a mating connector, a first annular sealing material 610 is filled and applied between the first sealing surface SL1 provided on the outer peripheral part of the case 200A and the second sealing surface SL2 provided on the outer peripheral part of the cover 300A, a sealing material 620 is filled and applied between the first fitting recess 204A provided in the opening 203 of the sealed housing 100A and the second fitting projection 520A provided on the outer periphery of the body of the connector housing 500A, a terminal part sealing material 600 is applied to a connecting surface which is the inner surface of the wall 510 for partitioning inside and outside of the connector housing 500A and is connected to the circuit substrate 400, and the sealed housing 100A provides an air hole 205A as a ventilation opening for forming a ventilation passage PS to be sealed when the case 200A and the cover 300A are integrated with the fastening member 110 in the sealed housing 100A or after being integrated.

With such a configuration as described above, it is possible to easily fill the waterproof sealing material in the assembling process of the waterproof electronic device without using the water repellent filter, and in the operational stage of the waterproof electronic device, it is possible to provide a waterproof electronic device having a simple and simple structure that can maintain airtightness even if a pressure difference occurs inside and outside the housing.

As described above, in the waterproof electronic device according to the first embodiment, the circuit substrate is housed in the hermetically sealed housing constituted by the case, the cover, and the first annular sealing material, a part of the connector housing mounted on the circuit substrate is configured to be exposed from the opening of the sealed housing through the second annular sealing material, a terminal part sealing material is applied to a plurality of connection terminals press-fitted to the inner and outer partition walls of the connector housing, and an air hole 205A is sealed when the case and the cover are integrated with each other by the fastening member 110 or after being integrated.

Therefore, in the process of integrating the case and the cover, the air inside the housing flows out through the air hole, the first and second annular sealing materials applied in advance are not pressed and flow out, since the air hole is closed when the case and the cover are integrated or after it is integrated, waterproofness during practical operation is not impaired, even if the air pressure inside the sealed housing changes due to the temperature difference between the inside and the outside of the sealed housing, it is possible to prevent water from being introduced from the press-fitting part between the connector housing and the connection terminal. According to this, it becomes unnecessary to use a conventionally used water repellent filter and there is an effect of softening the restriction on the attachment place of the hermetically sealed housing.

As shown in FIGS. 1 to 7, the production method of waterproof electronic device according to the first embodiment has the following characteristic configuration applied.

In the waterproof electronic device according to the first embodiment has the circuit substrate 400 hermetically sealed in a hermetically sealed housing 100A constituted by a case 200A and a cover 300A, the waterproof electronic device includes a resin-made connector housing 500A which is mounted on the circuit substrate and a part thereof is exposed from the opening 203 of the hermetically sealed housing 100A and a plurality of connection terminals 501 press-fitted into the wall 510 of the connector housing, and in which one end of the connection terminal 501 is connected to the circuit pattern of the circuit substrate 400, and the other end is in conductive contact with a contact terminal of a mating connector, a first annular sealing material 610 is filled and applied between the first sealing surface SL1 provided on the outer peripheral part of the case 200A and the second sealing surface SL2 provided on the outer peripheral part of the cover 300A0, the second annular sealing material 620 is filled and applied between the first fitting part 204 provided at the opening 203 of the sealed housing 100A and the second fitting projection 520A provided at the outer periphery of the body of the connector housing 500A, a terminal part sealing material 600 is applied to a connecting surface which is the inner surface of the wall 510 for partitioning inside and outside of the connector housing 500A and is connected to the circuit substrate 400, the sealed housing 100A is provided with a ventilation passage PS having an air hole 205A as an air vent that communicates the interior thereof with the atmosphere, and is sealed when the case 200A and the cover 300A are integrated by the fastening member 110, in the production method of the waterproof electronic device, the ventilation passage PS is sealed when the case 200A and the cover 300A are integrated with the fastening member 110 or after they are integrated.

With such a method as described above, it is possible to provide a waterproof sealing material that can easily be filled in a process of assembling a waterproof electronic device without using a water-repellent filter, and a waterproof electronic device having a compact and simple structure and a method for producing a waterproof electronic device that can maintain airtightness even if a pressure difference occurs inside and outside the housing in the practical stage of this waterproof electronic device In other words, in the waterproof electronic device according to the first embodiment, the circuit substrate is housed in a hermetically sealed housing constituted by the case, the cover, and the first annular sealing material, a part of the connector housing mounted on the circuit substrate is configured to be exposed from the opening of the sealed housing through the second annular sealing material, a terminal part sealing material is applied to a plurality of connection terminals press-fitted to the inner and outer partition walls of the connector housing, an air hole 205A is provided in the sealed housing, the air hole 205A is sealed when the case and the cover are integrated with each other by the fastening member or after they are integrated.

According to the waterproof electronic device disclosed in this application and the method for producing the waterproof electronic device, in the process of integrating the case and the cover, the first annular sealing material and the second annular sealing material which are applied in advance are not pressed and flown out, as the air inside the housing flows out through the ventilation passage, when the case and the cover are integrated, or after being integrated, the ventilation passage can be closed, waterproofness during practical operation is not impaired, even if the air pressure inside the hermetically sealed housing changes due to the temperature difference between the inside and the outside of the hermetically sealed housing, it is possible to prevent water from being introduced from the press-fitting part between the connector housing and the connecting terminal. According to this, it becomes unnecessary to use a conventionally used water repellent filter and there is an effect of softening the restriction on the attachment place of the hermetically sealed housing.

Second Embodiment (1) Detailed Explanation of the Configuration

This will be explained sequentially with focus on differences from those in FIG. 1. with respect to FIG. 8 which is a top external view of the waterproof electronic device according to the second embodiment, FIG. 9 which is disassembled structural view of the waterproof electronic device of FIG. 8, FIG. 10 which is a longitudinal front view of the section taken along the line Z10-Z10 of FIG. 8 as seen in the direction of the arrows, FIG. 11 which is a longitudinal sectional view showing an example of a fastening part for fastening the case and the cover in FIG. 8, FIG. 12A which is a vertical cross-sectional view showing an example of a part of the label attachment surface in FIG. 8, and FIG. 12B which is a longitudinal sectional view showing another example of a label attachment surface which is a modification of the part of the label attachment surface illustrated in FIG. 12A. In each drawing, the sealed housing 100B in the second embodiment corresponds to the hermetically sealed housing 100A in the first embodiment, and shows the difference in the embodiment depending on the difference in alphabet of uppercase letters in the reference numerals.

Figure 8:
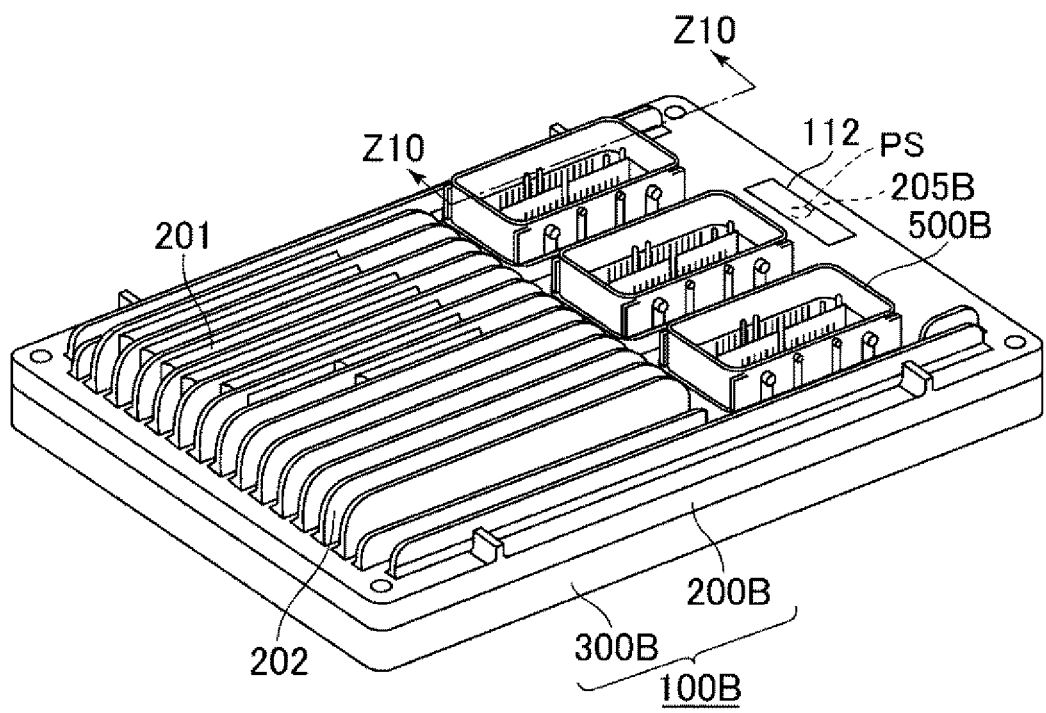
FIG. 8 is a diagram showing an example of a waterproof electronic device according to the second embodiment of the present application, and is a top appearance view as seen from the upper surface side.
Figure 9:
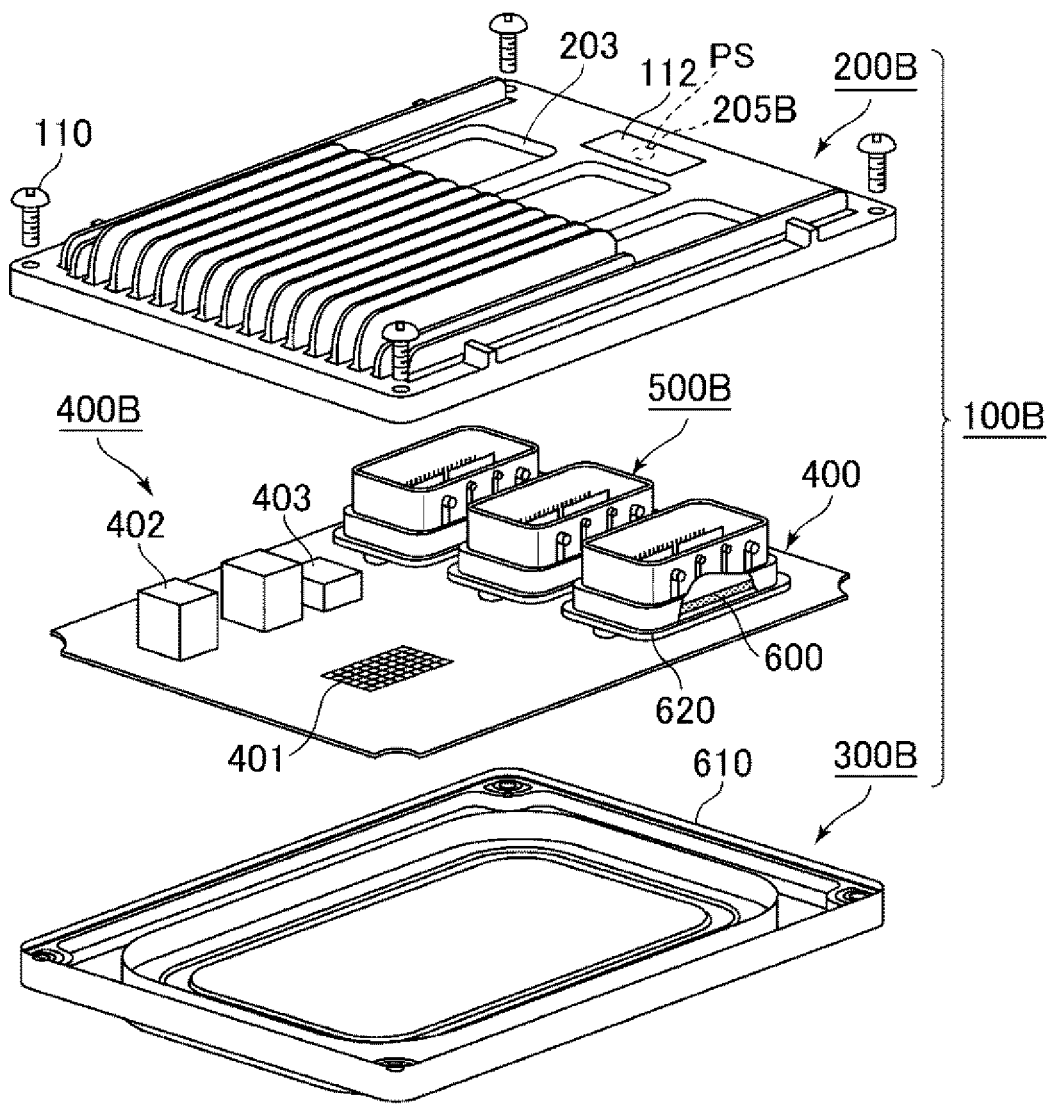
FIG. 9 is a disassembled structural view illustrating the disassembled waterproof electronic device shown in FIG. 8.

In FIGS. 8 and 9, the hermetically sealed housing 100B is configured to integrate a case 200B made of aluminum die-cast and a cover 300B made of resin by fastening members 110 each having four corners, for example, four screws. A circuit substrate 400 on which the connector housing 500B is mounted is hermetically sealed in the hermetically sealed housing 100B. A label 112, which is a rating plate, is affixed to the outer surface of the case 200B in order to seal the air hole 205B.

The deep bottom ceiling outer surface 201 indicates the outer surface of the deep side part provided in a part of the case 200B, and the heat sink 202 is provided on the outer surface of the case 200B. An opening 203 (see FIG. 9) is provided in the case 200B, and a part of the connector housing 500B is exposed from this opening 203.

On the circuit substrate 400, on the lower surface opposite to the mounting surface (upper surface in FIG. 9) of the connector housing 500B, for example, an integrated circuit device 401 including a microprocessor is mounted, on the upper surface, a tall component 402 such as an electrolytic capacitor and a heat-generating component 403 such as a transistor are mounted. The circuit substrate 400 and the connector housing 500B are integrated to form the board assembly 400B.

As will be described later with reference to FIG. 11, a second concave part 306B is provided on the outer periphery of the cover 300B, and the second concave part 306B and the first convex part 206B provided in the case 200B are fitted to each other. The first annular sealing material 610 is applied to the first concave part 306B.

Figure 10:
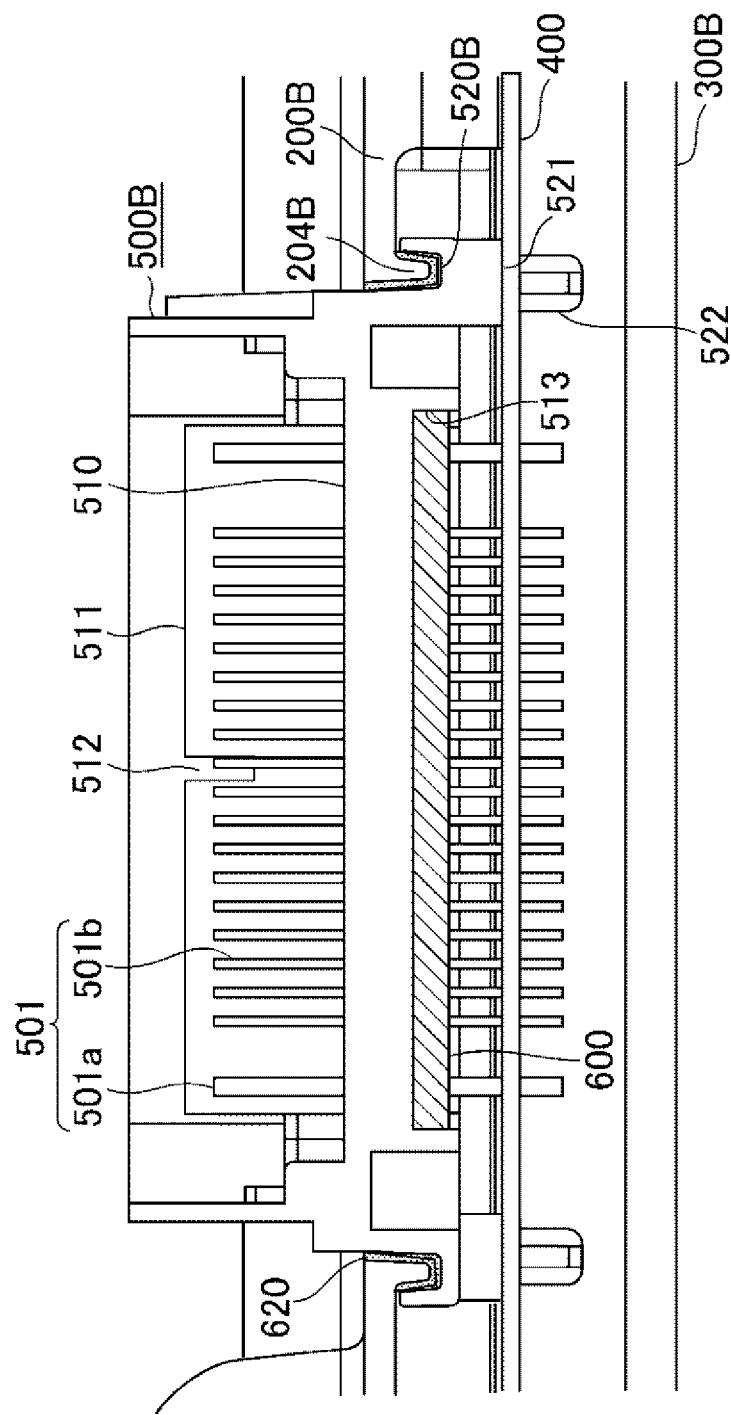
FIG. 10 is a vertical front view showing a cross section taken along line Z10-Z10 shown in FIG. 8 as seen in the direction of the arrow.

A second annular sealing material 620, which will be described later with reference to FIG. 10, is applied to the outer periphery of the outline of the connector housing 500B, a part of which is exposed from the opening part 203 of the case 200B, the inner surface of the connector housing 500B into which the connecting terminal 501 is press-fitted is filled with the terminal part sealing material 600.

In FIG. 10, the resin connector housing 500B, into which the mating connector (not shown) is inserted, provides an wall 510 for partitioning inside and outside, a terminal part wall 511 (see FIG. 4), a wrong insertion preventing groove 512 provided in the terminal partition wall 511, and a peripheral wall part 513 filled with the terminal part sealing material 600, and is configured similarly to FIG. 5.

The plurality of connection terminals 501 to be press-fitted into the terminal press-fitting fine holes 510p provided in the wall 510 for partitioning inside and outside, are divided into a large number of signal terminals 501b having a small cross-sectional area, and a small number of power terminals 501a having large cross-sectional areas provided in each of four inner corners of the connector housing 500A. The power terminal 501a and the signal terminal 501b are soldered to the connection land of the circuit substrate 400.

The distance between the circuit substrate 400 and the connector housing 500B and the mounting position is regulated by the positioning abutting surface 521 and the positioning penetrating part 522 provided in the connector housing 500B.

On the other hand, an outer periphery of connector housing 500B is provided with a second fitting recess 520B, and the second annular sealing material 620 is applied to the second fitting recess 520B. A first fitting projection 204B provided in the opening 203 of the case 200B is fitted into the second fitting recess 520B to which the second annular sealing material 620 is pre-applied.

Then, near the exit of the terminal press-fitting fine hole 510p of the connection terminal 501 provided in the wall 510 for partitioning inside and outside, an accumulating part 514 is provided, into which the terminal part sealing material 600 flows, with the hole diameter increased similarly to the FIG. 5.

Figure 11:
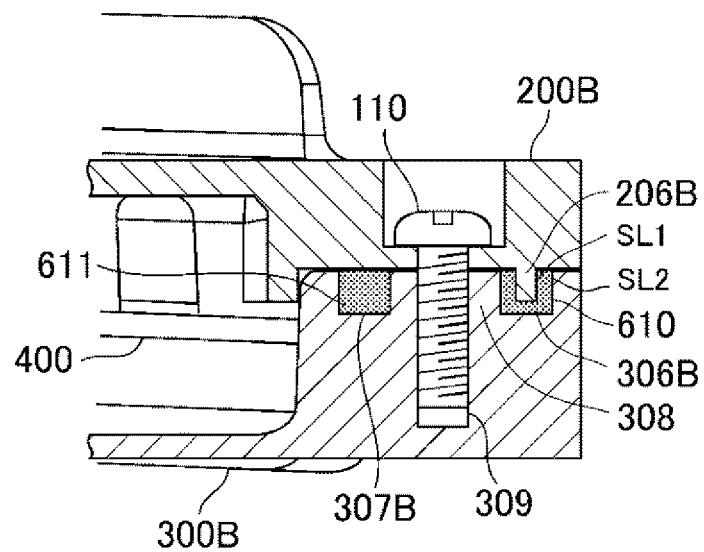
FIG. 11 is a longitudinal sectional view showing an example of a fastening part for fastening a case and a cover in FIG. 8.

In FIG. 11, a second concave part 306B is provided on the outer periphery of the cover 300B, a first annular sealing material 610 is applied to second first concave part 306B.

A junction concave line 307B is provided so as to surround each of the fastening seat 308 provided at the four corners of the cover 300B, the fastening part sealing material 611 is applied to all of the four junction concave line 307B.

Each of the fastening seat 308 is provided with a screw hole 309 so that the case 200B is screwed and fixed to the cover 300B at four corners by the fastening member 110.

In this way, the fastening seat 308 is surrounded by the first annular sealing material 610 and the fastening part sealing material 611, and is hermetically sealed so that a ventilation action between the head of the fastening member 110 and the contact surface of the case 200B does not occur. In the second embodiment, since the air holes (see FIG. 6C) are not provided in the fastening seat 308, the fastening part sealing material 611 is applied to all of the junction concave line 307B, as a result, it is unnecessary to provide a sealing material at the outer part of the fastening seat among the first annular sealing material 610 in FIG. 7.

Figure 12A:
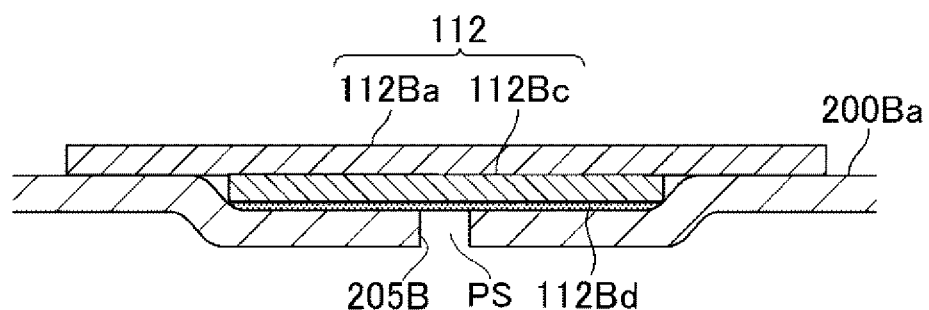
FIG. 12A is a longitudinal sectional view showing an example of a part of a label attachment surface in FIG. 8.

In FIG. 12A, a case part 200Ba which is a partial area of the case 200B is provided with a concavity part having an air hole 205B as an air vent constituting the ventilation passage PS, a flat label 112Ba is affixed to this concavity part via a reinforcing member 112Bc adhered with an adhesive bond 112Bd.

The flat label 112Ba which is the main body of the label 112 is a film material having an adhesive layer, the reinforcing member 112Bc is made of a plastic plate or an aluminum plate, therefore, it is possible to prevent the adhesive from being sequentially peeled off by the internal pressure of the hermetically sealed housing 100B.

Figure 12B:
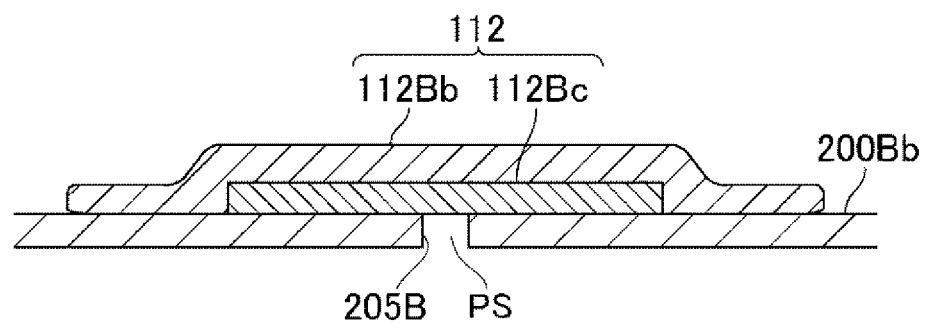
FIG. 12B is a longitudinal cross-sectional view showing an example of another label attachment surface which is a modification of the part of the label attachment surface illustrated in FIG. 12A.

In FIG. 12B, which is a variation of the part of the label attachment surface illustrated in FIG. 12A, a partial area of the case 200 B, a molding label 112Bb is attached to the case part 200Bb having the air hole 205B via a reinforcing member 112Bc.

The molding label 112Bb has an adhesive layer on its back surface. The molding label 112Bb holds the reinforcing member 112Bc so that the reinforcing member 112B is integrated with the adhesive layer. The molding label 112 Bb formed by integrating the reinforcing member 112 B is affixed to the surface of the case part 200 Bb with the adhesive layer and fixed to the case part 200 Bb.

(2) Detailed Explanation of the Assembly Procedure

First, the assembly procedure of the waterproof electronic device unit 100B will be described in detail with reference to FIG. 9 and FIG. 10 described above.

As illustrated in FIG. 9, the cover 300B is installed in an assembly jig (not shown) with its inner surface facing the ceiling, under this installation state, as illustrated in FIG. 9, the substrate assembly 400B which has been assembled in advance is mounted on the tray part provided on the inner surface of the cover 300B.

Next, a first annular sealing material 610 is applied to the second concave part 306B of the cover 300B and a fastening part sealing material 611 is annularly applied to the junction concave line 307B of the cover 300B as shown in FIG. 11, further, the second annular sealing material 620 is annularly applied to the second fitting concave part 520B of the connector housing 500B which will be described later with reference to FIG. 10.

Then, the case 200B is mounted, and the case 200B is fastened to the cover 300B by the fastening member 110 at four corners of the case 200B and fixed to the cover 300B. When the first annular sealing material 610 and the second annular sealing material 620 are of a heated-air drying type, heated-air drying is performed at this point. The terminal part sealing material 600 is heated and dried at the time of making the connector assembly.

Further, each inspection of the appearance and performance of the waterproof electronic device assembled as described above is performed by an inspection jig (not shown) as a result of each inspection, a label 112 (see FIG. 2) as a rating name plate with reference to FIG. 12A or FIG. 12B is affixed to the waterproof type electronic device which is judged as acceptance, after confirming that the label 112 has been affixed, assembly of the waterproof electronic device is completed.

Next the assembly procedure of the board assembly 400B itself will be described with reference to FIG. 10.

In FIG. 10, the connection terminal 501 is first press-fitted into the terminal press-fitting fine hole 510p with respect to a single piece of the connector housing 500B which is a resin molded material. The press-fitting direction of the connection terminal 501 into the terminal press-fitting fine hole 510p is a direction from the outside of the wall 510 for partitioning inside and outside to the inside (from the top to the down in FIG. 10), as a result, scratches do not occur on the contact surface part with the mating connector (not shown).

Next, the terminal part sealing material 600 is filled in the space part constituted by the inner surface of the wall 510 for partitioning inside and outside and the peripheral wall part 513. The terminal part sealing material 600 has lower viscosity than either of the first annular sealing material 610 and the second annular sealing material 620, therefore, the filling of the terminal part sealing material 600 into the space part is promptly performed through a space between a large number of connection terminals 501 arranged at a narrow pitch.

In this way, the connector assembly is configured.

The configured connector assembly is mounted on the circuit substrate 400, the connection terminals 501 of the connector assembly are soldered to the circuit substrate 400.

However, this assembling procedure describes a preferable procedure, after the connecting terminal 501 is press-fitted into the connector housing 500B, the connector housing 500B into which the connection terminal 501 is press-fitted is mounted on the circuit substrate 400, the soldering of the connection terminal 501 to the circuit substrate 400 is performed, it is also possible to inject the terminal part sealing material 600 from the injection hole of the sealing material provided on the circuit substrate 400. According to this procedure, there is a characteristic that the terminal part sealing material 600 is not exposed to the high temperature environment accompanying the soldering operation.

(3) Summary and Features in the Second Embodiment

As is apparent from the above description, the waterproof electronic device according to the second embodiment, the circuit substrate 400 is hermetically sealed in a hermetically sealed housing 100B constituted by a case 200B and a cover 300B, the waterproof electronic device includes a resin-made connector housing 500B which is mounted on the circuit substrate and a part thereof is exposed from the opening of the hermetically sealed housing 100B and a plurality of connection terminals 501 press-fitted into the wall 510 of the connector housing, and in which one end of the connection terminal is connected to the circuit pattern of the circuit substrate 400, and the other end is in conductive contact with a contact terminal of the mating connector, a first annular sealing material 610 is filled and applied between a first sealing surface SL1 provided on the outer peripheral part of the case 200B and a second sealing surface SL2 provided on the outer peripheral part of the cover 300B, a second annular sealing material 620 is filled and applied between a first fitting member 204 provided at the opening of the sealed housing 100B and a second fitting member 520 provided at the outer periphery of the body of the connector housing 500B, a terminal part sealing material 600 is applied to a connecting surface which is the inner surface of the wall 510 for partitioning inside and outside of the connector housing 500B and is connected to the circuit substrate 400, in the hermetically sealed housing 100B, an air hole 205B is provided which is sealed after the case 200B and the cover 300B are integrated with each other by the fastening member 110.

The first sealing surface SL1 includes a first convex part 206B provided on the outer peripheral part of the case 200B, the second sealing surface SL2 includes a second concave part 306B provided on the outer periphery of the cover 300B, the first annular sealing material 610 is applied to the first concave part 306B, and is engaged with the second convex part 206B, the first fitting member 204 includes a first fitting projection 204B provided in the opening 203 of the case 200B, the second fitting member 520 includes a second fitting recess 520B provided on the outer peripheral part of the body of the connector housing 500B, the second annular sealing material 620 is applied to the second fitting recess 520B and is engaged with the first fitting projection 204B, the first annular sealing material 610 is applied to the second concave part 306B and the second annular sealing material 620 is applied to the second fitting recess 520B as a second combination, the cover 300B is provided with a screw hole 309 into which a screw as the fastening member 110 is screwed.

As described above, the technical feature 2 of this application has the following features.

The first annular sealing material 610 is applied to the fitting recess 306B of the cover 300B, the second annular sealing member 620 is applied to the fitting recess 520B of the connector housing 500B, a screw hole 309 into which the fastening member 110 is screwed is provided on the side of the cover 300B having the fitting recess 306B. Therefore, the inner surface of the cover 300B is set facing the ceiling, the board assembly 400B of the circuit substrate 400 and the connector housing 500B is mounted on the cover 300B, thereafter, the cover 300B is put on the case 200B on which substrate assembly 400B is mounted, furthermore, the case 200B and the cover 300B are screwed and fastened to each other with the fastening member 110, the assembly can be easily performed from one direction.

The outer surface of the sealed housing 100B is provided with the air hole 205B communicating with the interior of the housing, and a label 112 including a reinforcing member 112Bc (see FIG. 12A or FIG. 12B) is affixed to the air hole 205B after the case 200B is united with the cover 300B by the fastening member 110.

Further, the technical feature 6 of this application has the following features.

A label 112 is affixed to the outer surface of the sealed housing 100B, an air hole 205 B communicating with the interior of the housing is provided on the rear surface of the label 112. Therefore, in the process of integrating the case 200B and the cover 300B, the label 112 is not pasted and the air hole is made effective, this prevents the overflow of the first annular sealing material 610 and the second annular sealing material 620.

In the state of the finished product to which the label 112 is affixed, the inside of the housing is hermetically sealed by the label 112, in addition, it is possible to save extra material cost by using the rating nameplate of the product as a label. In addition, the reinforcing member 112Bc included in the label 620 prevents the label 112 from gradually peeling off and the life deterioration due to the rise in the pressure of the inside of the housing. Further, in the first embodiment, the air hole 205B is provided in the cover 300A, by sealing the label 112, by applying the fastening part sealing material 611 to all of the junction concave line 307B surrounding the fastening seat 208, the elastic packing 111 is unnecessary for the fastening member 110.

Third Embodiment (1) Detailed Explanation of the Configuration and the Assembly Procedure With reference to FIG. 13 which is a longitudinal rear view of the example of the waterproof electronic device according to the third embodiment as viewed from the rear side, the difference from the one in FIG. 1 will be described in detail.

Figure 13:
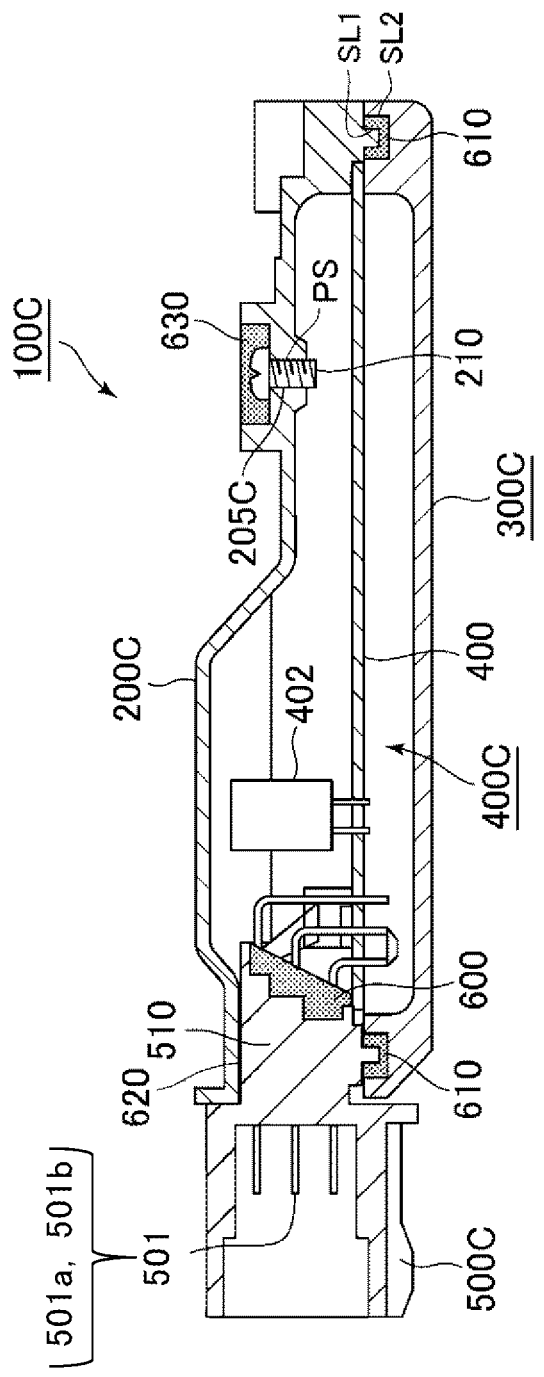
FIG. 13 is a longitudinal rear view showing an example of a waterproof electronic device according to the third embodiment of the present application, as seen from the rear side.

In FIG. 13, a waterproof electronic device unit 100C provides an hermetically sealing housing 100C including a case 200C having mounting feet not shown on four sides and a cover 300C, and a circuit substrate 400 housed in the sealed housing 100C, a part of a molded resin connector housing 500C mounted on one side of the circuit substrate 400 is exposed from the housing end face.

Further, a notched opening part for exposing a part of the connector housing 500C is provided on the side surface of the case 200C, the notched opening part is configured to be sealed by one side of the cover 300C.

On the wall 510 for partitioning inside and outside of the connector housing 500C, a plurality of right angle type connection terminals 501 are press-fitted and bent in a right angle direction. The press-fitting exit of the connection terminal 501 is sealed by the terminal part sealing material 600, by this sealing, ventilation that tries to pass through the terminal press-fitting fine hole 510$p$ is blocked.

One end of each connection terminal 501 of the connector housing 500C that has been subjected to the sealing process in this manner is soldered to one side of the circuit substrate 400 to constitute the substrate assembly 400C.

As for the connection terminal 501 in FIG. 1, the connection terminal 501 includes a large-diameter power terminal 501$a$ and a small-diameter signal terminal 501$b$.

A second concave part 306C constituting the second sealing surface SL2 is provided on the outer peripheral part of the contour of the cover 300C.

The cover 300C is installed in an assembly jig (not shown) with its inner surface facing the ceiling, in this installed state, the first annular sealing material 610 is applied to the second concave part 306C.

Then, the substrate assembly 400C is mounted on the case 200C, thereafter, a sealant is applied to the body part of the connector housing 500C.

The case 200C on which the substrate assembly 400C is mounted and the body of the connector housing 500C is sealed is covered with a cover 300C installed with its inner surface facing the ceiling. When the case 200C is put on the cover 300C, the sealing material on the outer periphery of the body part of the connector housing 500C joins with the first annular sealing material 610 to form a second annular sealing material 620.

In addition, the height part 402 mounted on the upper surface of the circuit substrate 400 and soldered to the circuit substrate 400 and the body part of the connector housing 500C are disposed at the deep bottom part of the case 200C.

The sealing screw 210 is screwed in the air hole 205 C provided in the shallow bottom part of the case 200C in the final assembling process, thereafter, an air hole sealing material 630 is applied to the head of the sealing screw 210, the air hole 205C is hermetically sealed by the air hole sealing material 630.

When a connection terminal of a right angle type or an L shape is used as the connection terminal 501, a part of the connector housing 500C is configured so as to be exposed from an opening part formed in a joint boundary surface between the case 200C and the cover 300C, such a configuration can be replaced by the connection terminal and the connector housing in the first and second embodiments.

In the above description, the hermetically sealed housing is constituted by a case and a cover, a connector housing is disposed between the case and the circuit substrate, the circuit substrate is arranged between the case and the cover.

On the other hand, if the part to be attached and fixed by the mounting feet to the vehicle body is called a base, the hermetically sealed housing is composed of a base and a mating cover integrated with the base, if it is assumed that the circuit substrate is housed in this sealed housing, either the case or the cover in the first to third embodiments serves as a base, and the other is a mating cover of the base. However, in the case where a clamper for holding and holding the hermetically sealed housing on the vehicle body side is prepared, the mounting feet of the base may be unnecessary in some cases, the base performs heat transfer heat dissipation to the vehicle body side, the cover will be classified as performing heat dissipation by convection or radiation. Further, the attachment surface of the vehicle body may be a floor surface or a ceiling surface, a wall surface or an inclined surface, the label sticking position may be provided, for example, on the side surface of the housing so that it can be visually observed in the state of being mounted on the vehicle.

The product configuration in the present application is such that it can be sequentially stacked up on the assembly jig, although the sealing material is adapted to be applied to the concave part which facilitates application, on a sealing surface that can ensure a sufficient sealing path on the structure, there is a case where it is not necessary to provide a convex-concave sealing surface.

In addition, since the first annular sealing material 610 and the second annular sealing material 620 have a viscosity similar as a toothpaste, and are extruded from a container of a sealing material via a thin pipe, it is also possible to apply a sealing material to the convex surface of the convex part.

Further, it is possible to change the assembling direction by rotating the jigs during the assembly work, therefore, the first sealing surface SL1 or the second sealing surface SL2 which can be a concave part or a convex part can be determined by other selection factors.

Then, even if the first annular sealing material 610 or the second annular sealing material 620 is applied on the convex part, by enlarging the area of the air hole, it is possible to suppress extrusion of the sealing material as the inside of the housing is pushed out when integrating the case and the cover.

(2) Summary and Features in the Third Embodiment

As is apparent from the above description, the waterproof electronic device according to the third embodiment, the circuit substrate 400 is hermetically sealed in a hermetically sealed housing 100C constituted by a case 200C and a cover 300C, the waterproof electronic device includes a resin-made connector housing 500C which is mounted on the circuit substrate and a part thereof is exposed from the opening of the hermetically sealed housing 100C and a plurality of connection terminals 501 press-fitted into the wall 510 of the connector housing, and in which one end of the connection terminal is connected to the circuit pattern of the circuit substrate 400, and the other end is in conductive contact with a contact terminal of the mating connector, a first annular sealing material 610 is filled and applied between a first sealing surface SL1 provided on the outer peripheral part of the case 200C and a second sealing surface SL2 provided on the outer peripheral part of the cover 300C, a second annular sealing material 620 is filled and applied between a first fitting member 204 provided at the opening of the sealed housing 100C and a second fitting member 520 provided at the outer periphery of the body of the connector housing 500C, a terminal part sealing material 600 is applied to a connecting surface which is the inner surface of the wall 510 for partitioning inside and outside of the connector housing 500C and is connected to the circuit substrate 400, in the hermetically sealed housing 100C, an air hole 205C is provided which is sealed after the case 200C and the cover 300C are integrated with each other by the fastening member.

An air hole 205C communicating with the interior of the housing is provided on the outer surface of the sealed housing 100C. The air hole 205C is a tapped hole which is closed by the closing screw 210 after the case 200C and the cover 300C are integrated by the fastening member, and a sealing member 630 for sealing the air hole is coated on the head part of the closing screw 210.

As described above, the technical feature 7 of this application has the following features.

A tapped hole serving as an air hole 205C is provided on the outer surface of the sealed housing 100C, a sealing member 630 for sealing the air hole is coated on the head part of the closing screw 210 for sealing the screw hole. Therefore, in the process of integrating the case 200C and the cover 300C, the air hole 205C is open, this prevents the overflow of the first annular sealing material 610 and the second annular sealing material 620. In addition, in the state of the finished product in which the air hole 205C is sealed by the closing screw 210, the inside of the housing is hermetically sealed, the press-fitting part of the contact terminal in the connector housing 500C is protected by the terminal part sealing material 600, so that overflow due to inhalation of outside air does not occur. This can also be substituted for those of the first and second embodiments.

The connector housing 500C is disposed between the case 200C and the circuit substrate 400, the circuit substrate 400 is disposed between the case 200C and the cover 300C, the air hole 205C is provided in the case 200C.

As described above, the technical feature 8 of this application has the following features.

The connector housing 500C is disposed between the case 200C having the air hole 205C and the circuit substrate 400. Therefore, when integrating the case 200C and the cover 200C, it is not affected by the airflow resistance between the front and back sides of the circuit substrate 400, the overflow of the first annular sealing material 610 and the second annular sealing material 620 can be suppressed.

These also apply for the first and second embodiments.

In the drawings, the same reference numerals indicate the same or corresponding parts.

Although the present application is described above in terms of an exemplary embodiment, it should be understood that the various features, aspects and functionality described in the embodiment are not limited in their applicability to the particular embodiment with which they are described, but instead can be applied, alone or in various combinations to the embodiment. It is therefore understood that numerous modifications which have not been exemplified can be devised without departing from the scope of the present application. For example, at least one of the constituent components may be modified, added, or eliminated.

REFERENCE SIGNS LIST 100A, 100B, 100C Hermetically sealed housing,
110 Fastening member,
111 Elastic packing,
112 Label,
112Ba Plane label,
112Bb Molding label,
112Bc Reinforcing material,
112Bd Adhesive agent bond,
200A, 200B, 200C Case,
200Ba Case part,
200Bb Case part,
201 Deep bottom ceiling outer surface,
202 Heat sink,
203 Opening part,
204 First fitting member,
204A First fitting recess,
204B First fitting projection,
205A, 205B, 205C Air hole,
206A First concave part,
206B First convex part,
207A Junction concave line,
208 Fastening seat,
209 Screw hole,
210 Sealed screw,
300A, 300B, 300C Cover,
306A Second convex part,
306B, 306C Second concave part,
307B Junction concave line,
308 Fastening seat,
309 Screw hole,
400 Circuit substrate,
400A, 400B Board assembly,
400C Board assembly,
401 Integrated circuit device,
402 Tall component,
403 Heat generating component,
500A, 500B, 500C Connector housing,
501 Connection terminal,
501A Power terminal,
501B Signal terminal,
510 Wall for partitioning inside and outside, 510P Terminal press-fitting fine hole,
511 Terminal partition wall,
512 Wrong insertion preventing groove,
513 Peripheral wall,
514 Accumulating part,
520 Second fitting member,
520A Second fitting projection,
520B Second fitting recess,
521 Abutting surface,
522 Positioning penetrating part,
600 Terminal part sealing material,
610 First annular sealing material,
611 Fastening sealing material,
612 Seal removal part,
620 Second annular sealing material,
630 Sealing material for sealed air hole,
P Arrangement interval,
W Terminal width,
SL1 First sealing surface,
SL2 Second seal surface,
PS Ventilation passage.

The invention claimed is:

1. A waterproof electronic device comprising:
a hermetically sealed housing constituted by a case and a cover having an opening,
a circuit substrate hermetically sealed in the hermetically sealed housing,
a resin-made connector housing having a wall, the resin-made connector housing being mounted on the circuit substrate and partially exposed from the opening of the hermetically sealed housing, and
a plurality of connection terminals press-fitted into the wall of the resin-made connector housing, wherein;
one end of the plurality of connection terminals is connected to a circuit pattern of the circuit substrate and the other end of the plurality of connection terminals is in conductive contact with a contact terminal of a mating connector,
a first annular sealing material is filled and applied between a first sealing surface provided on an outer peripheral part of the case and a second sealing surface provided on an outer peripheral part of the cover,
a second annular sealing material is filled and applied between a first fitting member provided at the opening of the hermetically sealed housing and a second fitting member provided at the outer periphery of a body of the resin-made connector housing,
a terminal part sealing material is applied to a connection surface which is an inner surface of the wall of the resin-made connector housing and is connected to the circuit substrate,
the case and the cover are fastened together by a fastening member so as to be integrated to constitute the hermetically sealed housing, and
the hermetically sealed housing is provided with a sealable ventilation passage that communicates an inside space of the hermetically sealed housing with outside air.

2. The waterproof electronic device according to claim 1, wherein;
the first sealing surface includes a first convex part or a first concave part provided on an outer peripheral part of the case,
the second sealing surface includes a second convex part or a second concave part provided on an outer peripheral part of the cover,
the first annular sealing material is applied to the first concave part or the second concave part,
the first concave part or the second concave part coated with the first annular sealing material is fitted into the second convex part or the first convex part,
the first fitting member includes a first fitting recess or a first fitting projection provided in the opening of the case,
the second fitting member includes a second fitting projection or a second fitting recess provided on the outer peripheral part of the body of the resin-made connector housing,
the second annular sealing material is applied to the first fitting recess or the second fitting recess,
the first fitting recess or the second fitting recess coated with the second annular sealing material is fitted into the second fitting projection or the first fitting projection,
in the case that the first annular sealing material is applied to the first concave part, the second annular sealing material is applied to the first fitting recess to serves as a first combination, a screw hole into which a screw as the fastening member is screwed is provided in the case, and
in the case that the first annular sealing material is applied to the second concave part, the second annular sealing material is applied to the second fitting recess to serve as a second combination, a screw hole into which a screw as the fastening member is screwed is provided in the cover.

3. The waterproof electronic device according to claim 1, wherein;
the first annular sealing material and the second annular sealing material are made of a room temperature or thermosetting adhesive having a viscosity of 15 Pa·s or more,
the terminal part sealing material is made of a nonconductive gel material for room temperature or thermosetting adhesive, has a viscosity lower than a viscosity of the first annular sealing material and the second annular sealing material, and has a heat resistance not melting at the solder melting temperature,
the resin-made connector housing includes a container-shaped space part constituted by an inner surface of the inner and outer partition wall and four peripheral wall parts and an accumulating part provided on the inner surface of the inner and outer partition wall,
a connector assembly built up by injecting the terminal part sealing material into the space part in a state where the plurality of connection terminals is press-fitted to the inner and outer partition walls, and
a board assembly is built up by the connector assembly being mounted on the circuit substrate and connected by soldering.

4. The waterproof electronic device according to claim 2, wherein;
the first annular sealing material and the second annular sealing material are made of a room temperature or thermosetting adhesive having a viscosity of 15 Pa·s or more,
the terminal part sealing material is made of a nonconductive gel material for room temperature or thermosetting adhesive, has a viscosity lower than a viscosity of the first annular sealing material and the second annular sealing material, and has a heat resistance not melting at the solder melting temperature, the resin-made connector housing includes a container-shaped space part constituted by an inner surface of the wall and four peripheral wall parts and an accumulating part provided on the inner surface of the wall, a connector assembly built up by injecting the terminal part sealing material into the space part in a state where the plurality of connection terminals is press-fitted to the wall, and a board assembly is built up by the connector assembly being mounted on the circuit substrate and connected by soldering.

5. The waterproof electronic device according to claim 1, wherein;

the plurality of connection terminals arranged in a planar manner in the wall includes a plurality of signal terminals and a plurality of power terminals having a larger cross-sectional area than the signal terminals and fewer than the signal terminals, the plurality of power terminals are arranged at four target positions, an arrangement interval P between the plurality of signal terminals with respect to the terminal width W of the signal terminal is a narrow pitch dimension having a $3 \times W \leq P \leq 5 \times W$ formula, and the cross-sectional area of the power terminal is three times or more the cross-sectional area of the signal terminal.

6. The waterproof electronic device according to claim 2, wherein;

the plurality of connection terminals arranged in a planar manner in the wall includes a plurality of signal terminals and a plurality of power terminals having a larger cross-sectional area than the signal terminals and fewer than the signal terminals, the plurality of power terminals are arranged at four target positions, an arrangement interval P between the plurality of signal terminals with respect to the terminal width W of the signal terminal is a narrow pitch dimension having a $3 \times W \leq P \leq 5 \times W$ formula, and the cross-sectional area of the power terminal is three times or more the cross-sectional area of the signal terminal.

7. The waterproof electronic device according to claim 3, wherein;

the plurality of connection terminals arranged in a planar manner in the wall includes a plurality of signal terminals and a plurality of power terminals having a larger cross-sectional area than the signal terminals and fewer than the signal terminals, the plurality of power terminals are arranged at four target positions, an arrangement interval P between the plurality of signal terminals with respect to the terminal width W of the signal terminal is a narrow pitch dimension having a $3 \times W \leq P \leq 5 \times W$ formula, and the cross-sectional area of the power terminal is three times or more the cross-sectional area of the signal terminal.

8. The waterproof electronic device according to claim 4, wherein;

the plurality of connection terminals arranged in a planar manner in the wall includes a plurality of signal terminals and a plurality of power terminals having a larger cross-sectional area than the signal terminals and fewer than the signal terminals, the plurality of power terminals are arranged at four target positions, an arrangement interval P between the plurality of signal terminals with respect to the terminal width W of the signal terminal is a narrow pitch dimension having a $3 \times W \leq P \leq 5 \times W$ formula, and the cross-sectional area of the power terminal is three times or more the cross-sectional area of the signal terminal.

9. The waterproof electronic device according to claim 1, wherein;

the first sealing surface includes a first concave part provided on the outer peripheral part of the case, the second sealing surface includes a second convex part provided on the outer peripheral part of the cover and fitted to the first concave part, a junction concave line arranged so as to surround a plurality of fastening seat to be fastening faces by a plurality of the fastening members is provided in the first concave part to which the first annular sealing material is communicated, the fastening part sealing material is applied to the junction concave line so as to prevent ventilation to the outside via the fastening surface, in a part of the junction concave line, the fastening part sealing material is not applied to a part of the junction concave line, an air hole for ventilating air from the fastening surface to the outside is formed, and an elastic packing is used for the packing of the fastening member applied to the fastening surface.

10. The waterproof electronic device according to claim 2, wherein;

the first sealing surface includes a first concave part provided on the outer peripheral part of the case, the second sealing surface includes a second convex part provided on the outer peripheral part of the cover and fitted to the first concave part, a junction concave line arranged so as to surround a plurality of fastening seat to be fastening faces by a plurality of the fastening members is provided in the first concave part to which the first annular sealing material is communicated, the fastening part sealing material is applied to the junction concave line so as to prevent ventilation to the outside via the fastening surface, in a part of the junction concave line, the fastening part sealing material is not applied to a part of the junction concave line, an air hole for ventilating air from the fastening surface to the outside is formed, and an elastic packing is used for the packing of the fastening member applied to the fastening surface.

11. The waterproof electronic device according to claim 3, wherein;

the first sealing surface includes a first concave part provided on the outer peripheral part of the case, the second sealing surface includes a second convex part provided on the outer peripheral part of the cover and fitted to the first concave part, a junction concave line arranged so as to surround a plurality of fastening seat to be fastening faces by a plurality of the fastening members is provided in the first concave part to which the first annular sealing material is communicated, the fastening part sealing material is applied to the junction concave line so as to prevent ventilation to the outside via the fastening surface, in a part of the junction concave line, the fastening part sealing material is not applied to a part of the junction concave line, an air hole for ventilating air from the fastening surface to the outside is formed, and an elastic packing is used for the packing of the fastening member applied to the fastening surface.

12. The waterproof electronic device according to claim 4, wherein;

the first sealing surface includes a first concave part provided on the outer peripheral part of the case, the second sealing surface includes a second convex part provided on the outer peripheral part of the cover and fitted to the first concave part, a junction concave line arranged so as to surround a plurality of fastening seat to be fastening faces by a plurality of the fastening members is provided in the first concave part to which the first annular sealing material is communicated, the fastening part sealing material is applied to the junction concave line so as to prevent ventilation to the outside via the fastening surface, in a part of the junction concave line, the fastening part sealing material is not applied to a part of the junction concave line, an air hole for ventilating air from the fastening surface to the outside is formed, and an elastic packing is used for the packing of the fastening member applied to the fastening surface.

13. The waterproof electronic device according to claim 5, wherein;

the first sealing surface includes a first concave part provided on the outer peripheral part of the case, the second sealing surface includes a second convex part provided on the outer peripheral part of the cover and fitted to the first concave part, a junction concave line arranged so as to surround a plurality of fastening seat to be fastening faces by a plurality of the fastening members is provided in the first concave part to which the first annular sealing material is communicated, the fastening part sealing material is applied to the junction concave line so as to prevent ventilation to the outside via the fastening surface, in a part of the junction concave line, the fastening part sealing material is not applied to a part of the junction concave line, an air hole for ventilating air from the fastening surface to the outside is formed, and an elastic packing is used for the packing of the fastening member applied to the fastening surface.

14. The waterproof electronic device according to claim 1, wherein;

the ventilation passage communicating with the interior of the housing opens on the outer surface of the hermetically sealed housing, and the hermetically sealed housing is configured to be able to stick a label including a reinforcing member for closing the ventilation passage.

15. The waterproof electronic device according to claim 2, wherein;

the ventilation passage communicating with the interior of the housing opens on the outer surface of the hermetically sealed housing, and the hermetically sealed housing is configured to be able to stick a label including a reinforcing member for closing the ventilation passage.

16. The waterproof electronic device according to claim 3, wherein;

the ventilation passage communicating with the interior of the housing opens on the outer surface of the hermetically sealed housing, and the hermetically sealed housing is configured to be able to stick a label including a reinforcing member for closing the ventilation passage.

17. The waterproof electronic device according to claim 1, wherein;

the ventilation passage communicating with the interior of the housing opens on the outer surface of the hermetically sealed housing, the ventilation passage is a tapped hole configured to be sealable with a closing screw, and a sealing material for sealing an air hole is coated on the head part of the closing screw.

18. The waterproof electronic device according to claim 1, wherein;

the resin-made connector housing is disposed between the case having the air hole and the circuit substrate, the circuit substrate is disposed between the case and the cover, and the ventilation passage is provided on the side of the case.

19. The waterproof electronic device according to claim 2, wherein;

the resin-made connector housing is disposed between the case having the air hole and the circuit substrate, the circuit substrate is disposed between the case and the cover, and the ventilation passage is provided on the side of the case.

20. A production method for waterproof electronic device comprising a hermetically sealed housing constituted by a case and a cover having an opening, a circuit substrate hermetically sealed in the hermetically sealed housing, a resin-made connector housing having a wall, the resin-made connector housing being mounted on the circuit substrate and partially exposed from the opening of the hermetically sealed housing, a plurality of connection terminals press-fitted into the wall of the connecter housing, and one end of the plurality of connection terminals connected to a circuit pattern of the circuit substrate and the other end being in conductive contact with a contact terminal of a mating connector, the method comprising the steps of:

filling and applying a first annular sealing material between a first sealing surface provided on an outer peripheral part of the case and a second sealing surface provided on an outer peripheral part of the cover;

filling and applying a second annular sealing material between a first fitting member provided at the opening of the hermetically sealed housing and a second fitting member provided at the outer periphery of a body of the resin-made connector housing;

applying a terminal part sealing material to a connection surface which is an inner surface of the wall of the resin-made connector housing and is connected to the circuit substrate; and providing the hermetically sealed housing with a sealable ventilation passage that communicates an inside of the hermetically sealed housing with outside air, wherein in the step of providing the hermetically sealed housing with the sealable ventilation passage, the ventilation passage is sealed when the case and the cover are integrated with a fastening member or after the case and the cover are integrated.

* * * * *